US008723093B2

(12) United States Patent
Krymski

(10) Patent No.: US 8,723,093 B2
(45) Date of Patent: May 13, 2014

(54) IMAGE SENSORS AND METHODS WITH SHARED CONTROL LINES

(76) Inventor: Alexander Krymski, Pasadena, CA (US)

( * ) Notice: Subject to any disclaimer, the term of this patent is extended or adjusted under 35 U.S.C. 154(b) by 177 days.

(21) Appl. No.: 13/287,765

(22) Filed: Nov. 2, 2011

(65) Prior Publication Data

US 2012/0175498 A1 Jul. 12, 2012

Related U.S. Application Data

(60) Provisional application No. 61/431,387, filed on Jan. 10, 2011.

(51) Int. Cl.
*H01L 27/00* (2006.01)
*H01L 27/16* (2006.01)

(52) U.S. Cl.
USPC ................................ 250/208.1; 257/E27.131

(58) Field of Classification Search
USPC ......... 250/208.1; 348/302–308; 257/E27.131
See application file for complete search history.

(56) References Cited

U.S. PATENT DOCUMENTS 3,758,794 A 9/1973 Kosonocky
4,309,624 A 1/1982 Hynecek et al.
5,541,402 A 7/1996 Ackland et al.
5,721,422 A * 2/1998 Bird .......................... 250/208.1
5,757,520 A 5/1998 Takashima
6,107,655 A 8/2000 Guidash
6,115,065 A 9/2000 Yadid-Pecht et al.
6,137,432 A 10/2000 Xiao
6,259,124 B1 7/2001 Guidash
6,352,869 B1 3/2002 Guidash
6,545,624 B2 4/2003 Lee et al.
6,552,745 B1 4/2003 Perner
6,573,936 B2 6/2003 Morris et al.
6,661,457 B1 12/2003 Mathur et al.
6,670,904 B1 12/2003 Yakovlev
6,870,565 B1 3/2005 Blerkom et al.

(Continued)

FOREIGN PATENT DOCUMENTS

JP 2001-024954 1/2001

OTHER PUBLICATIONS

A. Krymski et al., "A High Speed, 500 Frames/s, 1024×1024 CMOS Active Pixel Sensor", 1999 Symposium on VLSI Circuits Digest of Technical Papers, 1999, Kyoto, Japan, pp. 137-138.

(Continued)

*Primary Examiner* — Thanh Luu
*Assistant Examiner* — Renee Naphas
(74) *Attorney, Agent, or Firm* — Foley & Lardner LLP

(57) ABSTRACT

An image sensor includes a pixel array with a plurality of pixels. Two or more rows of pixels in the pixel array share a control line in the pixel array, and pixels of the two or more rows of pixels that are in a same column of the pixel array are connected to provide output to different column readout lines. A method includes providing a control signal over a control line within a pixel array to pixels in two or more rows of the pixel array, and reading out signals from the pixels in the two or more rows at a same time over different column readout lines. An image sensor includes a pixel array with a plurality of pixels, and two or more columns of pixels in the pixel array may share a control line in the pixel array for receiving a control signal.

24 Claims, 9 Drawing Sheets

(56) References Cited

U.S. PATENT DOCUMENTS

| | | | | |
|---|---|---|---|---|
| 6,953,923 | B2 | 10/2005 | Yang et al. | |
| 7,205,522 | B2 | 4/2007 | Krymski | |
| 7,238,977 | B2 | 7/2007 | Hong et al. | |
| 7,336,214 | B2 | 2/2008 | Krymski | |
| 7,400,279 | B2 | 7/2008 | Krymski | |
| 7,408,443 | B2 | 8/2008 | Nam | |
| 7,443,437 | B2 | 10/2008 | Altice et al. | |
| 7,488,928 | B2 | 2/2009 | Krymski | |
| 7,489,357 | B2 | 2/2009 | Nakada | |
| 7,659,925 | B2 | 2/2010 | Krymski | |
| 7,804,438 | B2 | 9/2010 | Krymski | |
| 7,876,362 | B2 | 1/2011 | Krymski | |
| 7,880,786 | B2 | 2/2011 | Muramatsu | |
| 2003/0011829 | A1 | 1/2003 | Dierickx | |
| 2003/0043089 | A1 | 3/2003 | Hanson et al. | |
| 2005/0110093 | A1* | 5/2005 | Altice et al. | 257/359 |
| 2005/0237408 | A1 | 10/2005 | Muramatsu | |
| 2007/0076109 | A1 | 4/2007 | Krymski | |
| 2007/0139242 | A1 | 6/2007 | Krymski | |
| 2008/0258042 | A1 | 10/2008 | Krymski | |
| 2009/0072120 | A1* | 3/2009 | McGarry et al. | 250/208.1 |
| 2009/0273694 | A1 | 11/2009 | Krymski | |
| 2009/0273696 | A1 | 11/2009 | Krymski | |
| 2010/0309351 | A1* | 12/2010 | Smith et al. | 348/280 |
| 2011/0080492 | A1 | 4/2011 | Matsuda et al. | |
| 2011/0080495 | A1 | 4/2011 | Busse et al. | |
| 2011/0139963 | A1 | 6/2011 | Krymski | |

OTHER PUBLICATIONS

Bock et al., "A Wide-VGA CMOS Image Sensor with Global Shutter and Extended Dynamic Range," Proc. of IEEE Workshop on CCDs and AIS, Karuizawa, 2005, pp. 222-225.

Nakamura et al., "CMOS Active Pixel Image Sensor with Simple Floating Gate Pixels," IEEE Transactions on Electron Devices, vol. 42, No. 9, Sep. 1995, pp. 1693-1694.

PCT International Search Report and Written Opinion report dated Aug. 29, 2007, from PCT application PCT/US06/38643.

S. Kleinfelder et al., "A 10,000 Frames/s CMOS Digital Pixel Sensor", IEEE Journal of Solid State Circuits, vol. 36, No. 12, pp. 2049-2059, Dec. 2001.

* cited by examiner

IMAGE SENSORS AND METHODS WITH SHARED CONTROL LINES

CROSS-REFERENCE TO RELATED PATENT APPLICATIONS

This application claims priority from U.S. Provisional App. Ser. No. 61/431,387, filed Jan. 10, 2011, the entire contents of which are incorporated by reference herein.

BACKGROUND OF THE INVENTION

1. Field of the Invention

Embodiments of the present invention relate generally to image sensors and methods and, in specific embodiments, to image sensors with control lines that provide control signals to pixels.

2. Related Art

Image sensors have found wide application in consumer and industrial electronics, and have enabled an explosion in a number of digital cameras and digital video devices used for work and entertainment.

FIG. 1 illustrates an architecture of a related art image sensor 1. The image sensor 1 includes a pixel array 2, a row driver 4, column readout circuitry 7, and a column circuit timing controller 9. The pixel array 2 includes pixels 3 that are arranged in rows and columns. Each pixel 3 includes a light sensitive element, such as a photodiode, or the like, to sample light intensity of a corresponding portion of a scene being imaged, and each pixel 3 is configured to produce an analog pixel signal based on the sampled light intensity. The row driver 4 supplies control signals to the pixels 3 in the pixel array 2 to control an operation of the pixels 3.

Pixels 3 that are in a same row of the pixel array 2 share common row control signals from the row driver 4. For example, pixels 3 in a first row of the pixel array 2 share common row control lines $\mathbf{5}_1$ for receiving control signals from the row driver 4. Similarly, pixels 3 in a second row of the pixel array 2 share common row control lines $\mathbf{5}_2$ for receiving control signals from the row driver 4, and pixels 3 in an $n^{th}$ row of the pixel array 2 share common row control lines $\mathbf{5}_n$ for receiving control signals from the row driver 4. Pixels 3 that are in a same column of the pixel array 2 share a common column readout line to provide output. For example, pixels 3 in a first column of the pixel array 2 share a column readout line $\mathbf{6}_1$, pixels 3 in a second column of the pixel array 2 share a column readout line $\mathbf{6}_2$, and pixels 3 in an $m^{th}$ column of the pixel array 2 share a column readout line $\mathbf{6}_m$. The row driver 4 controls the pixels 3 to provide output row by row.

FIG. 2 illustrates an example of a conventional pixel 3. The pixel 3 illustrated in FIG. 2 is provided as an example of a pixel in a $k^{th}$ column of a pixel array, such as the pixel array 2 (refer to FIG. 1). The pixel 3 includes a substrate 20, a photodiode (PD) 21, a transfer gate 22, a storage diffusion 23, an anti-blooming gate 24, an anti-blooming gate diffusion 25, a reset transistor 26, a source follower transistor (SF) 27, and a row select transistor 28. The storage diffusion 23 may also be called a floating diffusion (FD) node 23 or a readout node 23. The anti-blooming gate 24 may also be called a shutter gate 24. The photodiode 21 may be, for example, a pinned photodiode that collects charge during exposure based on the light intensity of a corresponding portion of a scene being imaged.

The transfer gate 22 is connected to receive a transfer control signal (TX), and the transfer gate 22 is controllable by the transfer control signal TX to transfer charge from the photodiode 21 to the storage diffusion 23. The anti-blooming gate 24 is connected to receive an anti-blooming control signal (AB), and the anti-blooming gate 24 is controllable by the anti-blooming control signal AB to allow for charge to be drained from the photodiode 21 to the anti-blooming gate diffusion 25. The anti-blooming gate diffusion 25 is connected to a reset voltage source (not shown) that supplies a reset voltage (Vrst).

A first terminal of the reset transistor 26 is connected to the reset voltage source that provides the reset voltage (Vrst). A gate of the reset transistor 26 is connected to receive a reset control signal (RST). A second terminal of the reset transistor 26 is connected to the storage diffusion 23 and to a gate of the source follower transistor 27. The gate of the source follower transistor 27 is connected to the storage diffusion 23 and to the second terminal of the reset transistor 26. A first terminal of the source follower transistor 27 is connected to a voltage source (not shown) that supplies a voltage (Vdd).

A second terminal of the source follower transistor 27 is connected to a first terminal of the row select transistor 28. A gate of the row select transistor 28 is connected to receive a row select control signal (ROW). A second terminal of the row select transistor 28 is connected to a column readout line $\mathbf{6}_k$ for providing a pixel output signal (pout) for the pixel 3 on the column readout line $\mathbf{6}_k$. Thus, the pixel 3 is controlled with the four control signals AB, TX, RST, and ROW, and the pixel 3 provides an output signal (pout).

If space allows, the anti-blooming gate diffusion 25 and a source terminal of the reset transistor 26 receive power from the reset voltage source (not shown) supplying the reset voltage Vrst, which can be run either horizontally, or vertically, or as a mesh in a pixel array. The source follower transistor 27 is powered from the voltage source (not shown) supplying Vdd, which is run as a vertical wire in each column of a pixel array. If space is tight, Vrst can be combined with Vdd.

FIG. 3 illustrates a circuit diagram representation of the pixel 3 of FIG. 2. In FIG. 3, the transfer gate 22 and the anti-blooming gate 24 are represented as gates of transistors, with a first terminal of each of those transistors connected to the photodiode 21. Those two transistors plus the reset transistor 26, the source follower transistor 27, and the row select transistor 28 equal five transistors, so the pixel 3 is conventionally referred to as a five transistor (5T) pixel. The floating diffusion node 23 is connected to the gate of the source follower transistor 27. The anti-blooming gate diffusion 25 is connected to a voltage source (not shown). The pixel 3 is connected to provide output on the column readout line $\mathbf{6}_k$.

An operation of the pixel 3 is now described with reference to FIGS. 2 and 3. When the anti-blooming control signal AB applied to the anti-blooming gate 24 is HIGH, all charges from the photodiode 21 are drained out into Vrst or Vdd (whatever is connected to the anti-blooming gate diffusion 25). When an image capture operation is initiated for the pixel 3, the anti-blooming control signal AB and the transfer control signal TX are controlled to be LOW, so that charge is collected during exposure in the photodiode 21. Prior to transferring the charge, the floating diffusion node 23 is cleared either with a reset pulse by controlling the reset control signal RST to be HIGH and then LOW, or the floating diffusion node 23 remained empty from a previous readout from the floating diffusion node 23.

The transfer of charge from the photodiode 21 to the floating diffusion node 23 is then performed by controlling the transfer control signal TX applied to the transfer gate 22 to be HIGH. After the transfer is done, the transfer control signal TX is controlled to be LOW, and a new exposure in the photodiode 21 can start, controlled by the anti-blooming control signal AB. The anti-blooming control signal AB can be controlled to be HIGH to cause charge to be drained from the photodiode 21, and then exposure starts with bringing the anti-blooming control signal AB to LOW. The readout of charge from the pixel 3 is done in parallel with an exposure that collects charge for a subsequent readout.

The readout from the pixel 3 can start right after the transfer of the charge from the photodiode 21 to the floating diffusion node 23. The readout is performed row by row in the pixel array 2 (refer to FIG. 1). To perform the readout from the pixel 3, the row select control signal ROW is controlled to be HIGH, and a pixel signal corresponding to a charge at the floating diffusion node 23 is read out over the column readout line $\mathbf{6}_k$. The row select control signal ROW is then controlled to be LOW, and the reset control signal RST is controlled to be HIGH to empty the floating diffusion node 23. The reset control signal RST is then controlled to be LOW and the row select control signal ROW is controlled to be HIGH to read out a potential (the reset value) of the empty floating diffusion node 23 over the column readout line $\mathbf{6}_k$.

The pixel signal corresponding to the charge at the floating diffusion node 23 prior to reset and the reset value corresponding to the reset potential at the floating diffusion node 23 after reset are provided to a corresponding column readout circuit 8 (refer to FIG. 1) for the column in which the pixel 3 is located. The column readout circuit 8 digitizes a difference between the pixel signal and the signal of the reset potential to provide a digital output representing the charge collected by the pixel 3 during the corresponding exposure.

With reference again to FIG. 1, the column readout circuitry 7 includes a column readout circuit 8 for each column of pixels 3 in the pixel array 2. Each column readout circuit 8 is connected to receive analog signals from a corresponding column readout line, and is configured to provide digital output on a corresponding output line. For example, the column readout circuit 8 for the first column is connected to the column readout line $\mathbf{6}_1$ for receiving input, and is connected to an output line $\mathbf{11}_1$ for providing output. Similarly, the column readout circuit 8 for the second column is connected to the column readout line $\mathbf{6}_2$ for receiving input, and is connected to an output line $\mathbf{11}_2$ for providing output, and the column readout circuit 8 for the $m^{th}$ column is connected to the column readout line $\mathbf{6}_m$ for receiving input, and is connected to an output line $\mathbf{11}_m$ for providing output. The column circuit timing controller 9 is configured to provide control signals to the plurality of column readout circuits 8 over one or more control lines 10.

FIG. 4 illustrates a portion of the pixel array 2 (refer to FIG. 1) including a pixel $\mathbf{3}_1$ in a first row and a first column of the pixel array 2 (refer to FIG. 1) and a pixel $\mathbf{3}_2$ in a second row and the first column of the pixel array 2 (refer to FIG. 1). The pixel $\mathbf{3}_1$ and the pixel $\mathbf{3}_2$ have a structure that is the same as the pixel 3 (refer to FIGS. 2 and 3), and the subscripts in the labels for the pixels are merely provided to indicate the rows in which the pixels are located.

The row control lines $\mathbf{5}_1$ for the first row include a reset control line (rst1), a row select control line (row1), a transfer control line (tx1), and an anti-blooming control line (ab1). With reference to FIGS. 3 and 4, the transfer gate 22 of the pixel $\mathbf{3}_1$ is connected to receive a transfer control signal over the transfer control line tx1; the anti-blooming gate 24 of the pixel $\mathbf{3}_1$ is connected to receive an anti-blooming control signal over the anti-blooming control line ab1; a gate of the reset transistor 26 of the pixel $\mathbf{3}_1$ is connected to receive a reset control signal over the reset control line rst1; and a gate of the row select transistor 28 of the pixel $\mathbf{3}_1$ is connected to receive a row select control signal over the row select control line row1. The reset control line rst1, the row select control line row1, the transfer control line tx1, and the anti-blooming control line ab1 for the row control lines $\mathbf{5}_1$ are shared by all pixels in the first row of the pixel array 2 (refer to FIG. 1), and the control signals on those lines are provided from the row driver 4 (refer to FIG. 1).

The row control lines $\mathbf{5}_2$ for the second row include a reset control line (rst2), a row select control line (row2), a transfer control line (tx2), and an anti-blooming control line (ab2). The transfer gate 22 of the pixel $\mathbf{3}_2$ is connected to receive a transfer control signal over the transfer control line tx2; the anti-blooming gate 24 of the pixel $\mathbf{3}_2$ is connected to receive an anti-blooming control signal over the anti-blooming control line ab2; a gate of the reset transistor 26 of the pixel $\mathbf{3}_2$ is connected to receive a reset control signal over the reset control line rst2; and a gate of the row select transistor 28 of the pixel $\mathbf{3}_2$ is connected to receive a row select control signal over the row select control line row2. The reset control line rst2, the row select control line row2, the transfer control line tx2, and the anti-blooming control line ab2 for the row control lines $\mathbf{5}_2$ are shared by all pixels in the second row of the pixel array 2 (refer to FIG. 1), and the control signals on those lines are provided from the row driver 4 (refer to FIG. 1).

The anti-blooming gate diffusion 25, the first terminal of the reset transistor 26, and the first terminal of the source follower transistor 27 of the pixel $\mathbf{3}_1$ are connected to a power source (not shown) to receive a voltage (Vdd) over a voltage line (pvdd) $\mathbf{12}_1$. The anti-blooming gate diffusion 25, the first terminal of the reset transistor 26, and the first terminal of the source follower transistor 27 of the pixel $\mathbf{3}_2$ are also connected to the power source (not shown) to receive the voltage (Vdd) over the voltage line (pvdd) $\mathbf{12}_1$, which is a shared voltage line among all the pixels in the first column of the pixel array 2 (refer to FIG. 1).

The pixel $\mathbf{3}_1$ is connected to provide output on the column readout line $\mathbf{6}_1$. The pixel $\mathbf{3}_2$ is also connected to provide output on the column readout line $\mathbf{6}_1$, which is a shared column readout line among all the pixels in the first column of the pixel array 2 (refer to FIG. 1). The pixels 3 in the pixel array 2 (refer to FIG. 1) are controlled row by row to provide output, so the pixels $\mathbf{3}_1$ and $\mathbf{3}_2$, which are in different rows from each other, provide output on the column readout line $\mathbf{6}_1$ at different times from each other.

As was mentioned above, the pixel 3 of FIG. 3 is conventionally referred to as a five transistor (5T) pixel. Other types of pixels have also been used in various image sensors. For example, an embodiment of a four transistor (4T) pixel is illustrated in FIG. 2A of U.S. patent application Ser. No. 12/405,903, filed Mar. 17, 2009, and published as U.S. Patent App. Pub. No. 2009/0273696, the entire contents of which are incorporated by reference herein. The 4T pixel, which is also referred to as a 4T rolling shutter pixel, may include a pinned photodiode and may allow for achieving low noise through the implementation of true correlated double sampling. In addition to a photodiode, the 4T pixel further includes a transfer gate connected to receive a corresponding in-row transfer control, a sense node (also called a floating diffusion) where charge from the photodiode is transferred via the transfer gate, a reset transistor connected to receive a corresponding in-row reset control to reset the floating diffusion, and a source follower (also called an amplifier) that can output a voltage onto a common vertical readout line upon enablement of a row select switch by a corresponding in-row row select control. The source follower and the reset transistor of the 4T pixel can be powered from pixel Vdd.

In the 4T rolling shutter pixels, the voltages at the floating diffusions are measured (read out through the source follower) in a selected row just before transfer of charge from the photodiode and then measuring the transferred charge. Each transfer empties the photodiode and starts a new integration of charge at the photodiode. Because the readout is done row by row, transfer control signals are applied to the image array row by row, and the exposure time for every next row is shifted by one row time. Such a readout from the pixel array is referred to as a "rolling shutter," meaning that the exposures are not simultaneous across the image array but rather are shifted with respect to the position of the row in the image. Measuring floating diffusion voltage before transferring the charge allows for removing KTC noise of the floating diffusion capacitor and achieves low readout noise. As a consequence, 4T rolling shutters have become popular in commercial image sensors such as image sensors used in cell phones.

A miniaturization of the 4T rolling shutter pixel was achieved through the sharing of readout circuitry, including the floating diffusion, the reset transistor, the source follower transistor, and the row select transistor, among neighboring pixels, such as sharing readout circuitry among two neighboring pixels in one row (horizontal sharing of readout circuitry) or among two neighboring pixels in one column (vertical sharing of readout circuitry) that are examples of 2-way share, or sharing readout circuitry among four nearby pixels (two vertical and two horizontal) that is an example of 4-way share. In the related art, when readout circuitry is combined between two pixels in different rows (vertical 2-way share or 4-way share), this removes one row control line and one reset control line for each two rows of pixels, so less control lines are needed to control the pixel array. There is still the requirement in the related art, however, to have separate transfer control lines for each row of pixels to have the ability to measure the charges from the individual photodiodes.

The rolling shutter operation discussed above is a type of shutter operation. Another type of shutter operation is a global shutter operation. Pixels that can be used for global shutter operations are called global shutter pixels. An example of a global shutter pixel is the 5T pixel illustrated in FIG. 3. In a global shutter operation, the transfer of charge from the photodiode of each pixel to the pixel storage of each pixel is done simultaneously for all pixels in the pixel array, so the exposure ends at a same time for all the pixels. The beginning of the exposure in the global shutter operation can be controlled, for example, by using a shutter or anti-blooming gate. In the 5T pixel, since the pixel storage is a floating diffusion, the pixel storages cannot be combined for neighboring pixels, because the storages keep the individual photodiode charges for a large portion of a frame time. As a consequence, the technique to share readout circuitry does not work for a 5T pixel, because the 5T pixel uses the readout node for storing charge for the shuttered signal and, thus, the readout node is individual to a particular pixel and cannot be shared with other pixels.

SUMMARY OF THE DISCLOSURE

Embodiments of the present invention allow for reducing a number of control lines crossing a pixel array by adding additional column readout lines and/or employing particular readout methods, and sharing control lines among two or more rows and/or columns of pixels in the pixel array. For example, in various embodiments there are two vertical column readout lines for each column of pixels in the pixel array, and all of the horizontal control lines extending across the pixel array for carrying signals to control pixels are shared among a corresponding two rows of pixels in the pixel array. In various other embodiments, there are four vertical column readout lines for each column of pixels in the pixel array, and all of the horizontal control lines extending across the pixel array for carrying signals to control pixels are shared among a corresponding four rows of pixels in the pixel array. Reducing a number of control lines crossing a pixel array allows for increasing a useful area for pixels, because less space is needed for the control lines. In various embodiments, two adjacent rows of a global shutter pixel array have common control lines, which allows for a smaller pixel size or for higher pixel sensitivity for a same pixel size.

An image sensor in accordance with an embodiment of the present invention includes a pixel array with a plurality of pixels. In various embodiments, two or more rows of pixels in the pixel array share a control line in the pixel array, and pixels of the two or more rows of pixels that are in a same column of the pixel array are connected to provide output to different column readout lines. In some embodiments, a portion of the control line that is located within the pixel array is connected within the pixel array to all pixels in the two or more rows of pixels. Also, in some embodiments, a portion of the control line is located between two of the two or more rows of pixels. In various embodiments, the two of the two or more rows of pixels are adjacent rows in the pixel array and are mirrored top-to-bottom with respect to each other. In some embodiments, the pixels comprise four transistor pixels or five transistor pixels or seven transistor pixels. In various embodiments, the pixels are controllable to perform a global shutter operation. Also, in various embodiments, the pixels are controllable to perform a rolling shutter operation.

In various embodiments, the two or more rows of pixels are adjacent rows in the pixel array. Also, in various embodiments, more than two rows of pixels in the pixel array share the control line in the pixel array. In some embodiments, each of the column readout lines is connected to a corresponding subset of pixels in a corresponding column of the pixel array. Also, in some embodiments, the control line is arranged such that a control signal provided over the control line passes an edge of the pixel array and is then distributed over the control line to the pixels in the two or more rows of pixels. In various embodiments, all horizontal control lines in the pixel array for the pixels in the two or more rows of pixels are shared among all of the pixels in the two or more rows of pixels. Also, in various embodiments, the control line that is shared by the two or more rows of pixels extends across the pixel array between two of the two or more rows of pixels.

In some embodiments, the control line comprises a transfer control line for distributing a transfer control signal to control a transfer of charge from a photodiode in each of the pixels in the two or more rows of pixels. Also, in some embodiments, the control line comprises an anti-blooming control line for distributing an anti-blooming control signal to control a draining of charge from a photodiode in each of the pixels in the two or more rows of pixels. In various embodiments, the control line comprises a reset control line for distributing a reset control signal to control a resetting of a floating diffusion node in each of the pixels in the two or more rows of pixels. Also, in various embodiments, the control line comprises a row select control line for distributing a row select control signal to control an outputting of a signal from each of the pixels in the two or more rows of pixels to corresponding column readout lines.

A method in accordance with an embodiment of the present invention includes providing a control signal over a control line within a pixel array to pixels in two or more rows of the pixel array, and reading out signals from the pixels in the two or more rows at a same time over different column readout lines. In various embodiments, a portion of the control line is located between two of the two or more rows, and the providing includes providing the control signal over the portion of the control line to all pixels in the two or more rows. Also, in various embodiments, the providing including providing the control signal over the control line to all pixels in adjacent columns of the pixel array. In some embodiments, the control signal comprises a transfer control signal that is provided to a transfer gate of each of the pixels in the two or more rows. In some embodiments, the control signal comprises an anti-blooming control signal that is provided to an anti-blooming gate of each of the pixels in the two or more rows.

An image sensor in accordance with an embodiment of the present invention includes a pixel array comprising a plurality of pixels, where two or more columns of pixels in the pixel array share a control line in the pixel array for receiving a control signal. In various embodiments, the control line comprises a transfer control line for distributing a transfer control signal to control a transfer of charge from a photodiode in each of the pixels in the two or more columns of pixels. In some embodiments, the control line comprises an anti-blooming control line for distributing an anti-blooming control signal to control a draining of charge from a photodiode in each of the pixels in the two or more columns of pixels. In various embodiments, the pixel array includes two or more column readout lines for each column of pixels in the pixel array, and each column readout line is connected to a corresponding subset of pixels in a corresponding column of the pixel array.

DETAILED DESCRIPTION OF PREFERRED EMBODIMENTS

Figure 5:
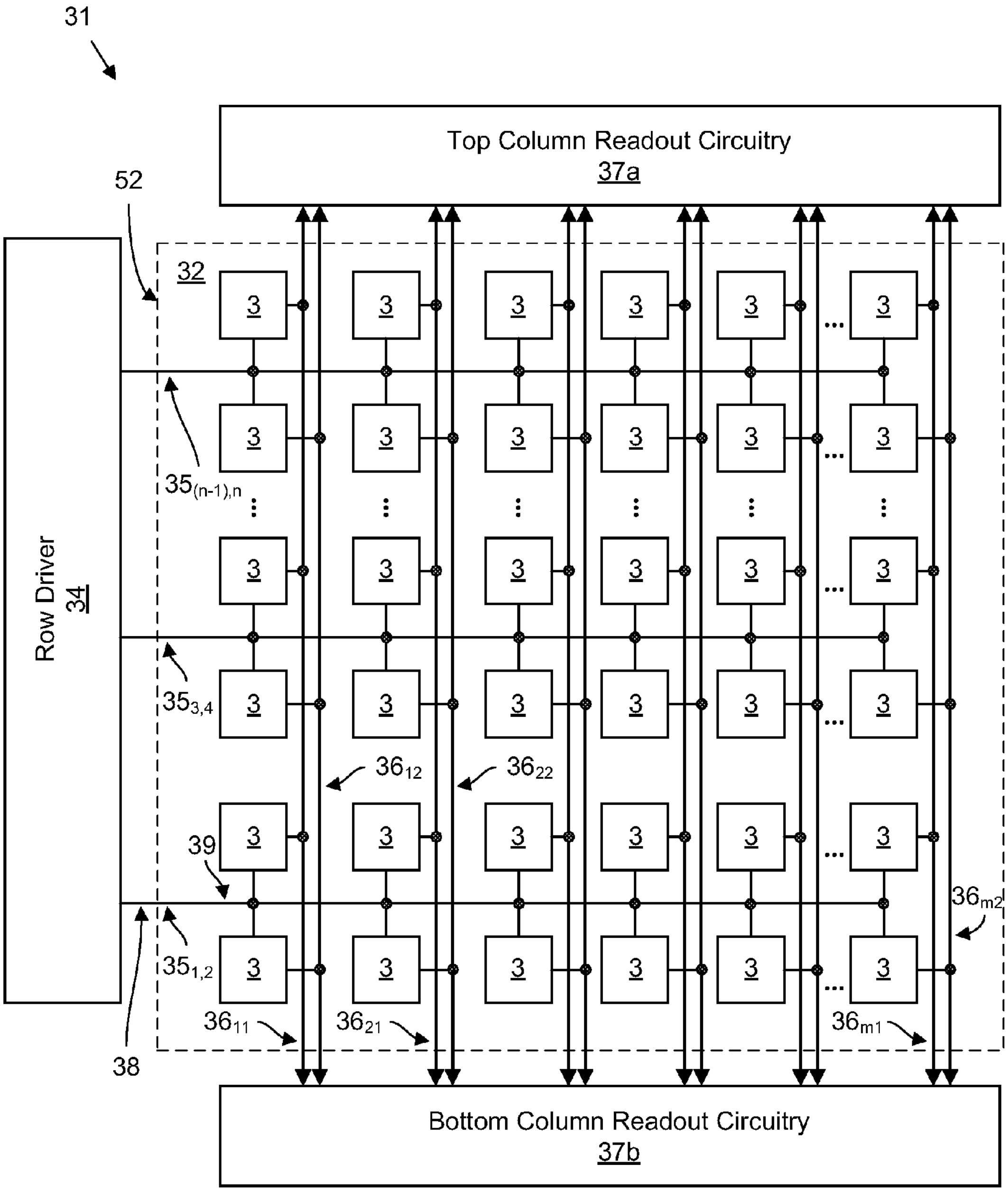
FIG. 5 illustrates a block diagram of an image sensor in accordance with an embodiment of the present invention.

FIG. 5 illustrates a block diagram of an image sensor 31 in accordance with an embodiment of the present invention. The image sensor 31 includes a pixel array 32, a row driver 34, top column readout circuitry 37*a*, and bottom column readout circuitry 37*b*. In various embodiments, the image sensor 31 may be, for example, a high speed complimentary metal oxide semiconductor (CMOS) image sensor, or the like.

Figure 2:
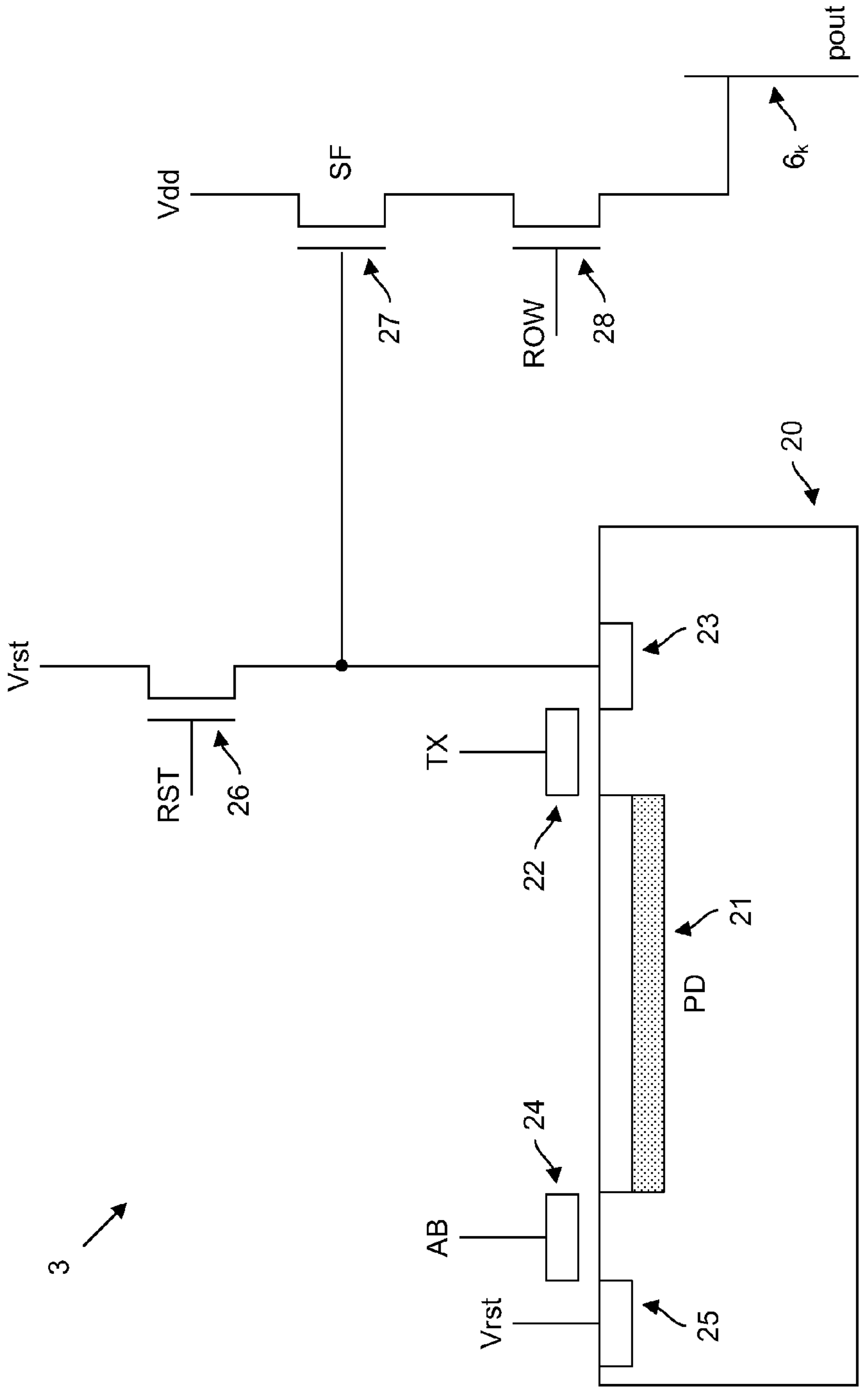
FIG. 2 illustrates an example of a conventional pixel.
Figure 3:
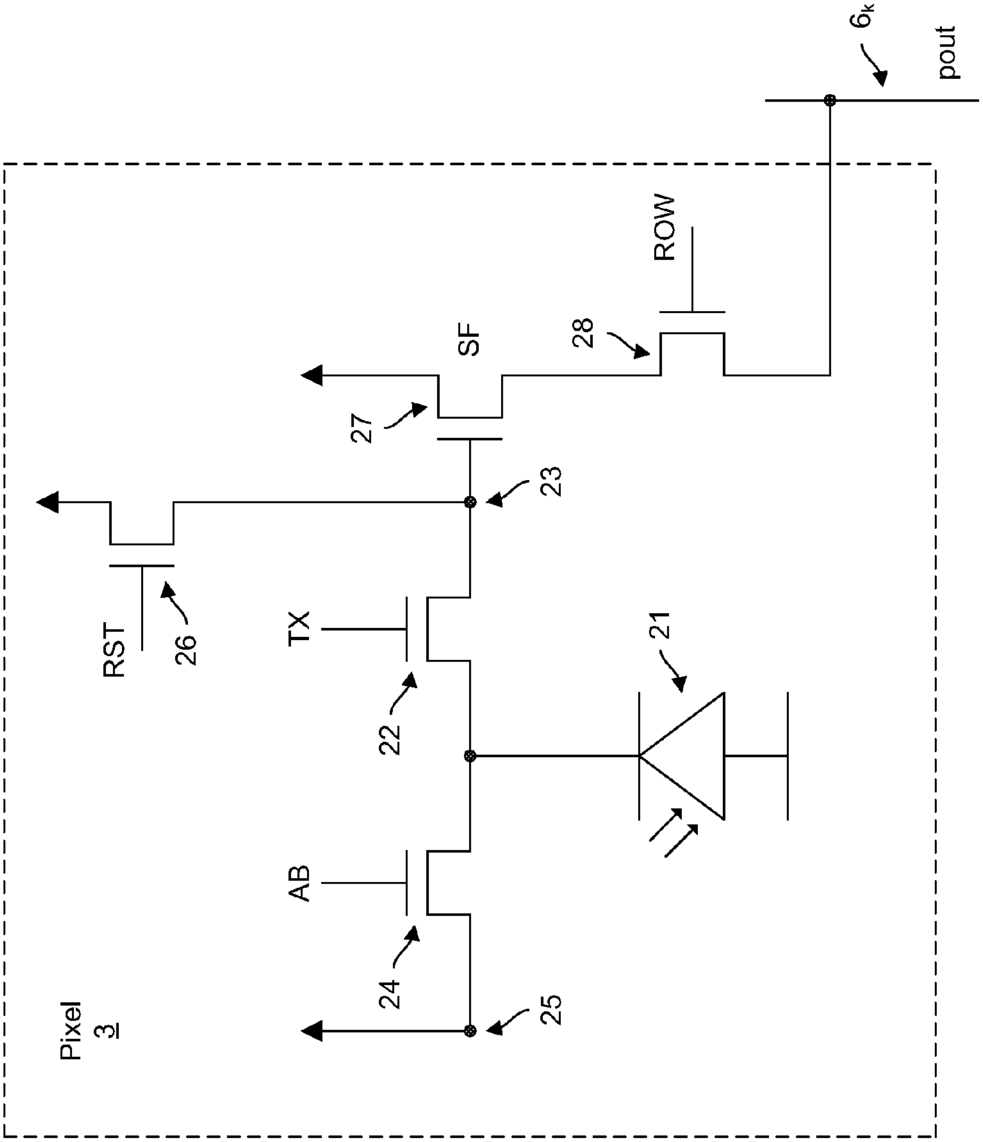
FIG. 3 illustrates a circuit diagram representation of the pixel of FIG. 2.

The pixel array 32 includes a plurality of pixels 3 arranged in a plurality of rows and a plurality of columns. For example, the pixels 3 in the pixel array 32 may be arranged in n rows and m columns, where n and m are integer values. Each pixel 3 of the pixel array 32 is configured to sample light intensity and to provide a corresponding analog pixel signal based on the sampled light intensity. In various embodiments, each pixel 3 is a five transistor (5T) pixel with an architecture as illustrated in FIGS. 2 and 3. In various other embodiments, other types of pixels may be used for the pixels 3 of the pixel array 32, such as four transistor (4T) pixels, seven transistor (7T) pixels, or the like.

The image sensor 31 further includes a plurality of control lines $\mathbf{35}_{1,2}$, $\mathbf{35}_{3,4}$, . . . , $\mathbf{35}_{(n-1),n}$, for providing control signals generated by the row driver 34 to the pixels 3. The subscript in the label for each of the control lines indicates the rows in the pixel array 32 to which the control lines are connected. In various embodiments, control lines may be shared by pixels in different rows. In some embodiments, adjacent rows of pixels 3 share the same control lines. For example, in the embodiment illustrated in FIG. 5, the first and second rows of pixels 3 in the pixel array 32 share control lines $\mathbf{35}_{1,2}$, such that control signals are provided from the row driver 34 over the control lines $\mathbf{35}_{1,2}$ to the pixels 3 in the first and second rows of the pixel array 32. Also, in the embodiment illustrated in FIG. 5, the third and fourth rows of pixels 3 in the pixel array 32 share control lines $\mathbf{35}_{3,4}$, such that control signals are provided from the row driver 34 over the control lines $\mathbf{35}_{3,4}$ to the pixels 3 in the third and fourth rows of the pixel array 32. Similarly, in the embodiment illustrated in FIG. 5, the $(n-1)^{st}$ and $n^{th}$ rows of pixels 3 in the pixel array 32 share control lines $\mathbf{35}_{(n-1),n}$, such that control signals are provided from the row driver 34 over the control lines $\mathbf{35}_{(n-1),n}$ to the pixels 3 in the $(n-1)^{st}$ and $n^{th}$ rows of the pixel array 32. In FIG. 5, the control lines that are connected to adjacent rows are shown as a single line, for simplicity. It should be appreciated that, in some embodiments, there are four or more control lines connected to adjacent rows.

Analog pixel signals output by the plurality of pixels 3 may be, for example, current signals, voltage signals, charge signals, or the like. Each analog pixel signal may be based on, for example, a sampled light intensity of a portion of a scene being imaged. In some embodiments, analog pixel signals may have a single component for representing a value of sampled light intensity, while in other embodiments, analog pixel signals may have more than one component, such as having both a photosignal component and a reference reset level component for representing a value of sampled light intensity.

The image sensor 31 includes a plurality of column readout lines $\mathbf{36}_{11}$, $\mathbf{36}_{12}$, $\mathbf{36}_{21}$, $\mathbf{36}_{22}$, . . . , $\mathbf{36}_{m1}$, $\mathbf{36}_{m2}$ to carry output signals from the pixels 3. In various embodiments, when rows share all controls from common control lines, they operate in parallel, so the pixels in those rows are connected to different column readout lines to avoid a conflict of two pixels driving a same column readout line at a same time. In the embodiment illustrated in FIG. 5, there are two column readout lines per each column of pixels 3 in the pixel array 32. In various other embodiments, there may be more than two column readout lines per each column of pixels 3 in the pixel array 32. In various embodiments, each column in the pixel array 32 includes a corresponding first set of pixels 3 connected to output analog pixel signals to a respective first column readout line, and a corresponding second set of pixels 3 connected to output analog pixel signals to a respective second column readout line. In some embodiments, each column in the pixel array 32 includes a corresponding first set of pixels 3 connected to output analog pixel signals to only a respective first column readout line, and a corresponding second set of pixels 3 connected to output analog pixel signals to only a respective second column readout line.

For example, in the embodiment illustrated in FIG. 5, a first set of pixels 3 in a first column of the pixel array 32 are connected to the column readout line $\mathbf{36}_{11}$ to output analog pixel signals to only the column readout line $\mathbf{36}_{11}$, and a second set of pixels 3 in the first column of the pixel array 32 are connected to the column readout line $\mathbf{36}_{12}$ to output analog pixel signals to only the column readout line $\mathbf{36}_{12}$. Also, for example, in the embodiment illustrated in FIG. 5, a first set of pixels 3 in an $m^{th}$ column of the pixel array 32 are connected to the column readout line $\mathbf{36}_{m1}$ to output analog pixel signals to only the column readout line $\mathbf{36}_{m1}$, and a second set of pixels 3 in the $m^{th}$ column of the pixel array 32 are connected to the column readout line $\mathbf{36}_{m2}$ to output analog pixel signals to only the column readout line $\mathbf{36}_{m2}$.

In various embodiments, for each column in the pixel array 32, each pixel 3 connected to the respective first column readout line for the column is located in a row that is adjacent to a row in which a corresponding pixel 3 is connected to the respective second column readout line for the column. For example, in the embodiment illustrated in FIG. 5, a pixel 3 in the first column of the pixel array 32 that is connected to the column readout line $\mathbf{36}_{11}$ is located in a row that is directly next to or adjacent to a row in which a corresponding pixel 3 is connected to the column readout line $\mathbf{36}_{12}$. In some embodiments, for each column in the pixel array 32, pixels 3 in even numbered rows are connected to the respective first column readout line for the column and pixels 3 in odd numbered rows are connected to the respective second column readout line for the column. Also, in some embodiments, for each column in the pixel array 32, pixels 3 in odd numbered rows are connected to the respective first column readout line for the column and pixels 3 in even numbered rows are connected to the respective second column readout line for the column. Thus, in various embodiments, pixels 3 in adjacent rows and in a same column of the pixel array 32 may be connected to different column readout lines.

The row driver 34 is configured to supply control signals to the plurality of pixels 3 in the pixel array 32. In some embodiments, pixels 3 that are in a same row of the pixel array 32 share a common row control signal from the row driver 34. In various embodiments, the row driver 34 includes circuitry that is configured to control the pixels 3 in the pixel array 32 to perform processing two rows at a time, such that pixels 3 in two rows activated by the row driver 34 sample light intensity and provide analog pixel signals as output at a same time. In such embodiments, for example, each pixel 3 in a first row of the two activated rows may output analog pixel signals to a respective first column readout line for the column in which the pixel 3 is located, and each pixel 3 in a second row of the two activated rows may output analog pixel signals to a respective second column readout line for the column in which the pixel 3 is located.

For example, in the embodiment illustrated in FIG. 5, control signals provided by the row driver 34 are provided over the control lines $\mathbf{35}_{1,2}$ within the pixel array 32 to pixels 3 in both a first row and a second row of the pixel array 32 at a same time. As a consequence, in the example, when the row driver 34 provides a control signal to activate the first and second rows in the pixel array 32 to provide output, the pixels 3 in the first row output analog pixel signals to the respective column readout lines for the columns, and the pixels 3 in the second row output analog pixel signals to different respective column readout lines for the columns. Thus, in various embodiments, analog pixel signals from multiple rows of the pixel array 32 can be readout at a same time using the multiple column readout lines per column of pixels 3 in the pixel array 32.

In the example, after the first and second rows of pixels 3 have output analog pixel signals, the row driver 34 may activate the third and fourth rows of pixels 3 in the pixel array 32 at a same time, such that pixels 3 in the third and fourth rows output analog pixel signals at a same time. In various embodiments, the row driver 34 is configured to continue activating pairs of rows in a sequence until activating rows n−1 and n at a same time, at which time the row driver 34 may repeat the processing starting again at the first and second rows in the pixel array 32. In various other embodiments, the row driver 34 may be configured to activate at a same time any desired combination of two rows in which the pixels 3 in the two rows are connected to output analog pixel signals to different column readout lines. Also, in some embodiments, there may be more than two column readout lines per column of pixels 3 in the pixel array 32, and the row driver 34 may be configured to activate more than two rows of pixels 3 in the pixel array 32 at a same time. In some embodiments, the image sensor 31 may further include a second row driver (not shown) that has a same architecture as the row driver 34 and that is located on an opposite side of the pixel array 32 from the row driver 34. In such embodiments, the second row driver may then be connected to the same control lines as the row driver 34 to allow for two side driving of control signals into the pixel array 32.

The top column readout circuitry 37*a* may include a plurality of column readout circuits (not shown in FIG. 5) that are connected to receive analog pixel signals provided from pixels 3 of the pixel array 32. The bottom column readout circuitry 37*b* may similarly include a plurality of column readout circuits (not shown in FIG. 5) that are connected to receive analog pixel signals provided from pixels 3 of the pixel array 32. Each column readout circuit in the top column readout circuitry 37*a* and the bottom column readout circuitry 37*b* is connected to receive analog pixel signals provided from corresponding pixels 3 of the pixel array 32, and is configured to convert the received analog pixel signals into digital pixel signals.

Figure 6:
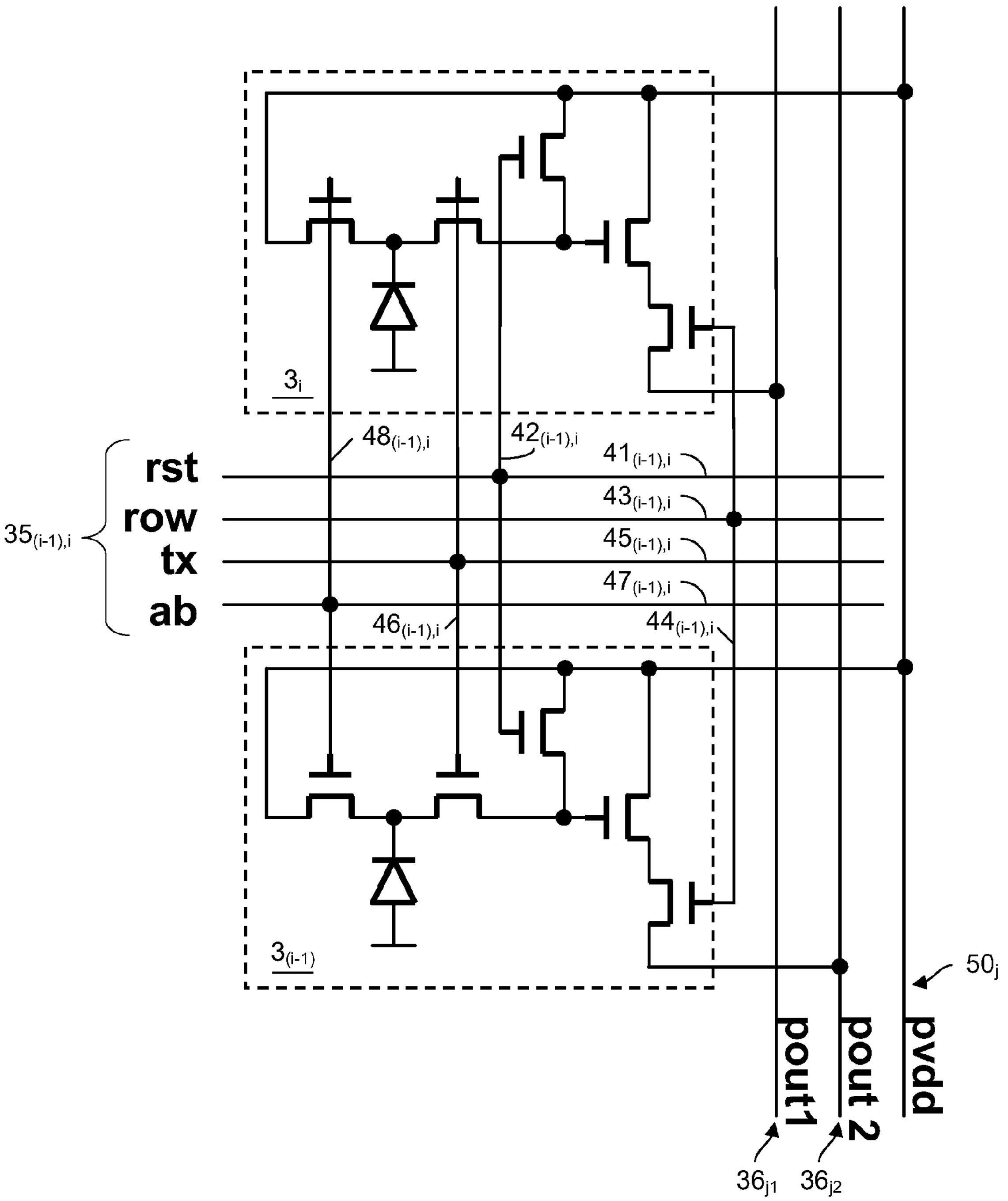
FIG. 6 illustrates a portion of an image sensor in accordance with an embodiment of the present invention.

FIG. 6 illustrates a portion of the image sensor 31 (refer to FIG. 5) in accordance with an embodiment of the present invention. With reference to FIGS. 5 and 6, the portion of the image sensor 31 that is shown in FIG. 6 includes a pixel 3, in a row i and a column j of the pixel array 32 and a pixel $\mathbf{3}_{(i-1)}$ in a row (i−1) and the column j of the pixel array 32. The pixel $\mathbf{3}_i$ and the pixel $\mathbf{3}_{(i-1)}$ are illustrated as having a structure that is the same as the pixel 3 (refer to FIGS. 2 and 3), and the subscripts in the labels for the pixels are merely provided to indicate the rows in which the pixels are located. In various other embodiments, any suitable type of pixel may be used in the pixel array 32, such as a four transistor (4T) pixel, a seven transistor (7T) pixel, or the like.

In various embodiments, the control lines $\mathbf{35}_{(i-1),i}$ for rows i and i−1 include a reset control line (rst) $\mathbf{41}_{(i-1),i}$, a row select control line (row) $\mathbf{43}_{(i-1),i}$, a transfer control line (tx) $\mathbf{45}_{(i-1),i}$, and an anti-blooming control line (ab) $\mathbf{47}_{(i-1),i}$. With reference to FIGS. 3, 5, and 6, the image sensor 31 further includes a connection line $\mathbf{42}_{(i-1),i}$, a connection line $\mathbf{44}_{(i-1),i}$, a connection line $\mathbf{46}_{(i-1),i}$, and a connection line $\mathbf{48}_{(i-1),i}$. The reset control line $\mathbf{41}_{(i-1),i}$, is connected within the pixel array 32 to a gate of the reset transistor 26 of the pixel $\mathbf{3}_i$ and to a gate of the reset transistor 26 of the pixel $\mathbf{3}_{i-1}$ by the connection line $\mathbf{42}_{(i-1),i}$. The row select control line $\mathbf{43}_{(i-1),i}$, is connected within the pixel array 32 to a gate of the row select transistor 28 of the pixel $\mathbf{3}_i$ and to a gate of the row select transistor 28 of the pixel $\mathbf{3}_{i-1}$ by the connection line $\mathbf{44}_{(i-1),i}$. The transfer control line $\mathbf{45}_{(i-1),i}$, is connected within the pixel array 32 to the transfer gate 22 of the pixel $\mathbf{3}_i$ and to the transfer gate 22 of the pixel $\mathbf{3}_{i-1}$ by the connection line $\mathbf{46}_{(i-1),i}$. The anti-blooming control line $\mathbf{47}_{(i-1),i}$, is connected within the pixel array 32 to the anti-blooming gate 24 of the pixel $\mathbf{3}_i$ and to the anti-blooming gate 24 of the pixel $\mathbf{3}_{i-1}$ by the connection line $\mathbf{48}_{(i-1),i}$. The reset control line $\mathbf{41}_{(i-1),i}$, the row select control line $43_{(i-1),i}$, the transfer control line $45_{(i-1),i}$, and the anti-blooming control line $47_{(i-1),i}$ for the control lines $35_{(i-1),i}$ are shared by all pixels in row i and row i−1 of the pixel array 32, and the control signals on those control lines are provided from the row driver 34.

The anti-blooming gate diffusion 25, the first terminal of the reset transistor 26, and the first terminal of the source follower transistor 27 of the pixel $3_i$ are connected to a power source (not shown) to receive a voltage (Vdd) over a voltage line (pvdd) $50_j$. The anti-blooming gate diffusion 25, the first terminal of the reset transistor 26, and the first terminal of the source follower transistor 27 of the pixel $3_{(i-1)}$ are also connected to the power source (not shown) to receive the voltage (Vdd) over the voltage line (pvdd) $50_j$, which is a shared voltage line among all the pixels in column j of the pixel array 32. The pixel $3_i$ is connected to provide output on the column readout line (pout1) $36_{j1}$. The pixel $3_{(i-1)}$ is connected to provide output on the column readout line (pout2) $36_{j2}$. Since the pixel $3_i$ and the pixel $3_{(i-1)}$ are connected to different column readout lines from each other, they can provide output at a same time.

An operation of the pixel $3_i$ and the pixel $3_{(i-1)}$ is now described. When an anti-blooming control signal applied to the anti-blooming gate 24 of each of the pixels $3_i$ and $3_{i-1)}$ over the anti-blooming control line $47_{(i-1),i}$ is HIGH, all charges from the photodiode 21 of each of the pixels $3_i$ and $3_{(i-1)}$ are drained out into Vdd by the voltage line $50_j$. When an image capture operation is initiated for the pixels $3_i$ and $3_{(i-1)}$, the anti-blooming control signal is controlled to be LOW, and a transfer control signal applied to the transfer gate 22 of each of the pixels $3_i$ and $3_{(i-1)}$ over the transfer control line $45_{(i-1)}$, is controlled to be LOW, so that charge is collected during exposure in the photodiode 21 of each of the pixels $3_i$ and $3_{(i-1)}$. Prior to transferring the charge, the floating diffusion node 23 of each of the pixels $3_i$ and $3_{(i-1)}$ is cleared either with a reset pulse by controlling a reset control signal provided to a gate of the reset transistor 26 of each of the pixels $3_i$ and $3_{(i-1)}$ over the reset control line $41_{(i-1),i}$ to be HIGH and then LOW, or the floating diffusion node 23 of each of the pixels $3_i$ and $3_{(i-1)}$ remained empty from a previous readout from the floating diffusion node 23 of each of the pixels $3_i$ and $3_{(i-1)}$.

The transfer of charge from the photodiode 21 of each of the pixels $3_i$ and $3_{(i-1)}$ to the corresponding floating diffusion node 23 is then performed by controlling the transfer control signal applied to the transfer gate 22 of each of the pixels $3_i$ and $3_{(i-1)}$ to be HIGH. After the transfer is done, the transfer control signal is controlled to be LOW, and a new exposure in the photodiode 21 of each of the pixels $3_i$ and $3_{(i-1)}$ can start, controlled by the anti-blooming control signal. The anti-blooming control signal can be controlled to be HIGH to cause charge to be drained from the photodiode 21 of each of the pixels $3_i$ and $3_{(i-1)}$, and then exposure starts with bringing the anti-blooming control signal to LOW. The readout of charge from each of the pixels $3_i$ and $3_{(i-1)}$ is done in parallel with an exposure that collects charge in each of the pixels $3_i$ and $3_{(i-1)}$ for a subsequent readout.

The readout from each of the pixels $3_i$ and $3_{(i-1)}$ can start right after the transfer of the charge from the photodiode 21 of each of the pixels $3_i$ and $3_{(i-1)}$ to the floating diffusion node 23 of each of the pixels $3_i$ and $3_{(i-1)}$. The readout is performed two rows at a time in the pixel array 32. To perform the readout, a row select control signal provided to a gate of the row select transistor 28 of each of the pixels $3_i$ and $3_{(i-1)}$ over the row select control line $44_{(i-1),i}$ is controlled to be HIGH, and a pixel signal corresponding to a charge at the floating diffusion node 23 of the pixel $3_i$ is read out over the column readout line $36_{j1}$, while a pixel signal corresponding to a charge at the floating diffusion node 23 of the pixel $3_{(i-1)}$ is read out over the column readout line $36_{j2}$ at a same time. The row select control signal is then controlled to be LOW, and the reset control signal is controlled to be HIGH to empty the floating diffusion node 23 of each of the pixels $3_i$ and $3_{(i-1)}$. The reset control signal is then controlled to be LOW and the row select control signal is controlled to be HIGH to read out a potential (the reset value) of the empty floating diffusion node 23 of the pixel $3_i$ over the column readout line $36_{j1}$, and to read out a potential (the reset value) of the empty floating diffusion node 23 of the pixel $3_{(i-1)}$ over the column readout line $36_{j2}$ at a same time.

In accordance with the embodiment illustrated in FIGS. 5 and 6, adjacent rows of pixels 3 in the pixel array 32 share the same control lines, such that pixels 3 in adjacent rows receive control signals over the same control lines within the pixel array 32. In various embodiments, the image sensor 31 is controlled to perform a global shutter operation in which an exposure in all rows is started and ended at a same time by controlling all anti-blooming control signals and all transfer control signals for all rows simultaneously. The readout from the pixels 3 can then be performed two rows at a time. The pixel 3 of FIG. 3 can be used for a global shutter operation and, thus, can be referred to as a five transistor (5T) global shutter pixel. A 5T global shutter pixel, such as the pixel 3, uses the floating diffusion node 23 for storing charge for a shuttered signal while waiting for readout from the pixel 3 and, thus, the floating diffusion node $23_i$ which acts as a readout node, is individual to a particular pixel and cannot be shared with other pixels.

With reference again to FIGS. 5 and 6, in various embodiments a shared control scheme allows for two neighboring rows of global shutter pixels to share all controls, including the anti-blooming control, transfer control, reset control, and row select control. Also, in various embodiments, two pixels in a same column of a pixel array have their outputs connected to separate vertical column readout lines. In various embodiments, the column readout lines $36_{11}$, $36_{12}$, $36_{21}$, $36_{22}$, . . . , $36_{m1}$, $36_{m2}$ are vertical readout busses, and two pixels in the same column have their outputs connected to separate vertical readout busses. In the embodiment of FIGS. 5 and 6, since two rows of pixels share all controls, they operate in parallel, so they have separate outputs to avoid a conflict of two pixels driving a same output bus. Thus, in various embodiments, two adjacent rows of pixels share all horizontal controls and the two adjacent rows are connected to two separate vertical readout busses.

Figure 4:
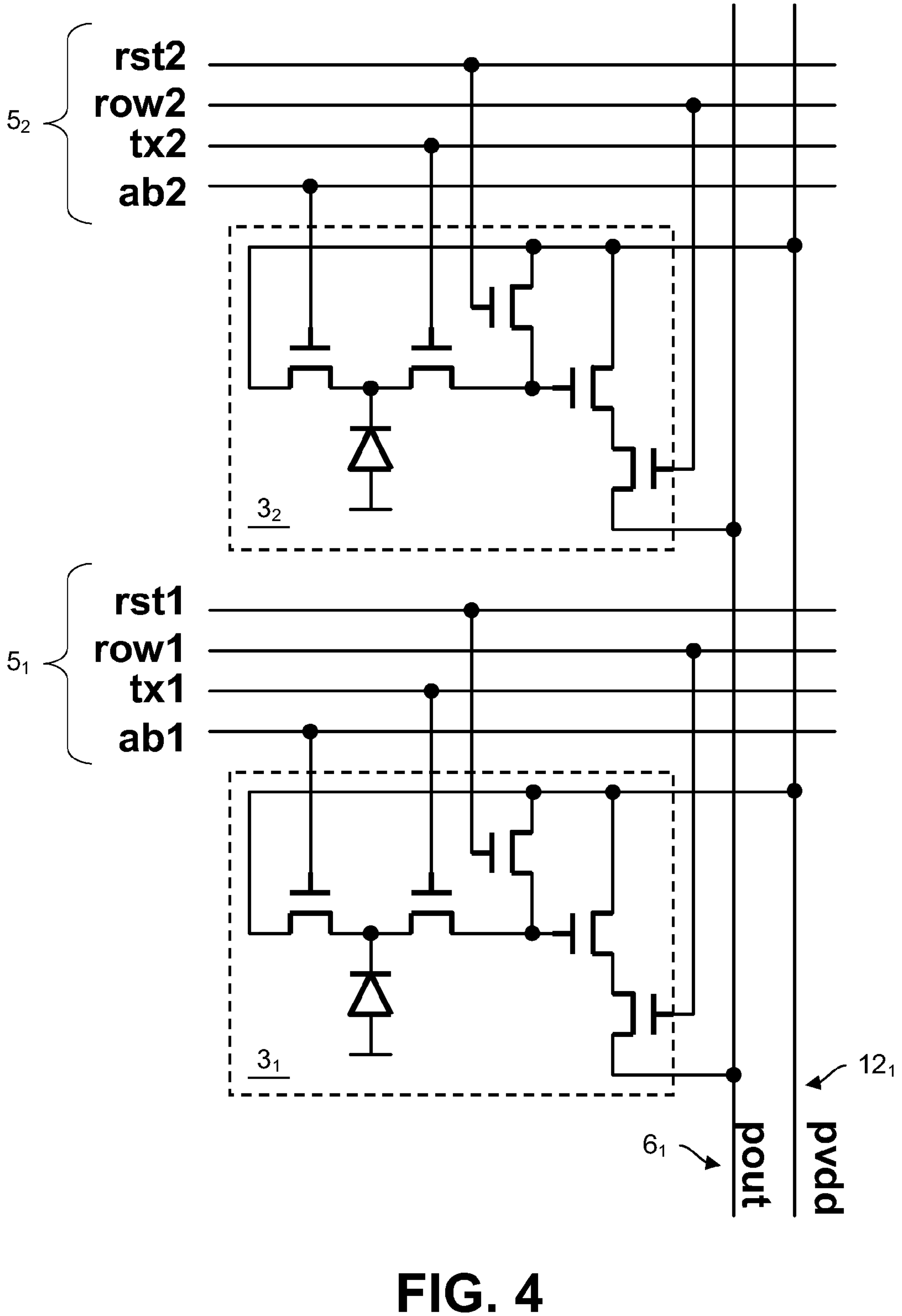
FIG. 4 illustrates a portion of a related art pixel array.

It is instructive to compare the embodiment illustrated in FIG. 6 with the conventional architecture of FIG. 4. The conventional architecture of FIG. 4 requires eight horizontal control lines and one vertical readout line for two rows of pixels. In contrast, the embodiment illustrated in FIG. 6 has four horizontal control lines and two vertical readout lines for two rows of pixels. Thus, as compared with the architecture in FIG. 4, the embodiment illustrated in FIG. 6 eliminates four horizontal control lines for each two rows of pixels while adding one vertical readout line per column, resulting in a saving of space in the image sensor. In the conventional architecture of FIG. 4, a row control could not be shared between two rows, because the two pixels would drive the same column readout line at a same time, which would result in an error. By introducing a second column readout line for each column of pixels, as in the architecture of FIG. 6, the same row control line can be shared between two rows as is done in the architecture of FIG. 6, because the pixels in the two rows can output signals at a same time over different column readout lines. With two vertical column readout lines, which are also called vertical readout busses, per column of pixels in a pixel array, the control lines across the pixel array for carrying control signals to neighboring rows of pixels can be shared, and the readouts from the rows sharing the controls can be performed simultaneously with each other.

Figure 1:
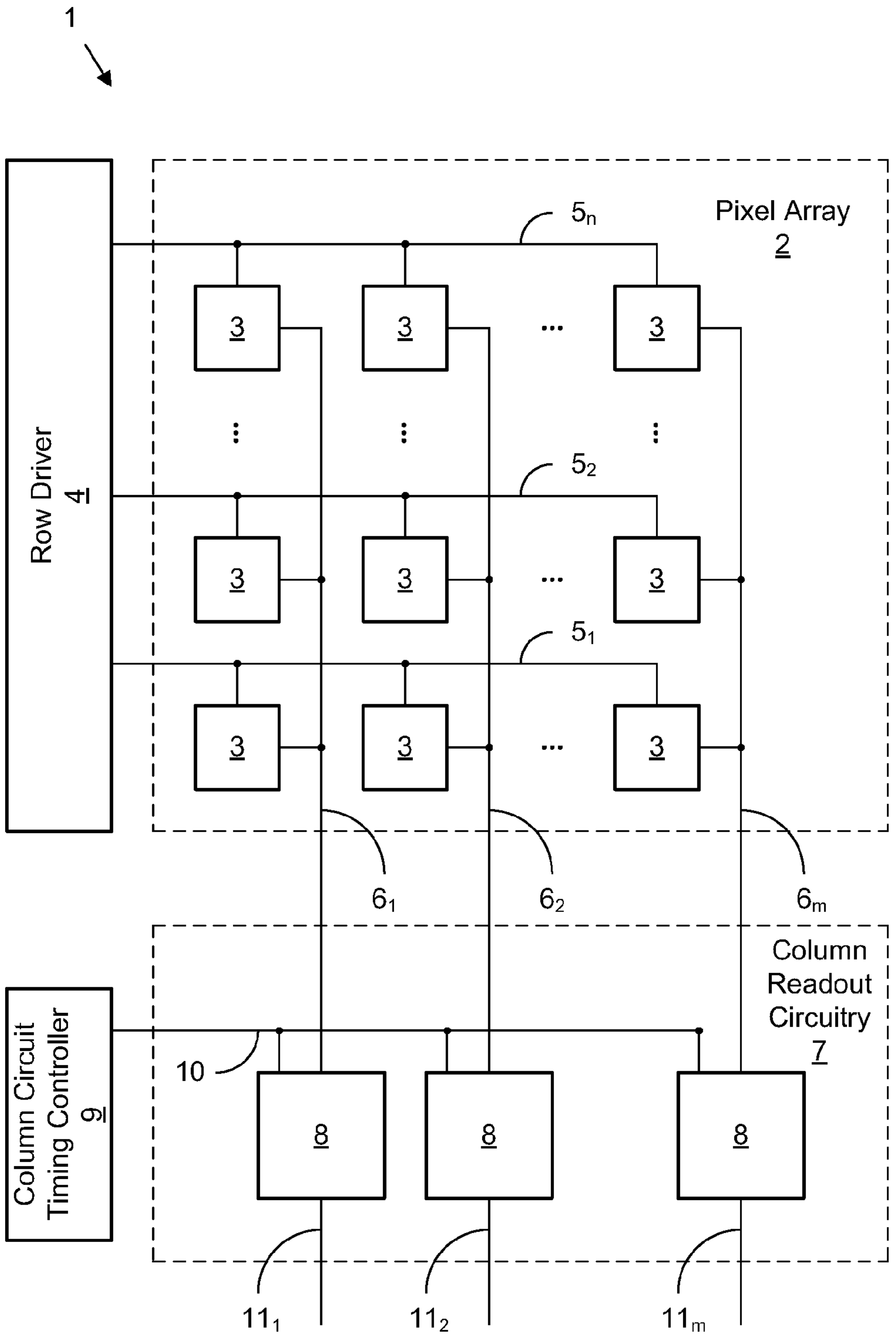
FIG. 1 illustrates an architecture of a related art image sensor.

With reference to FIG. 5, in various other embodiments, a seven transistor (7T) global shutter pixel can be used in the pixel array 32 for the pixels $\mathbf{3}_i$ which will also allow for a global shutter operation. An example of a 7T pixel is illustrated in FIG. 1 of U.S. patent application Ser. No. 12/963,566, filed Dec. 8, 2010, and published as U.S. Patent App. Pub. No. 2011/0139963 the entire contents of which are incorporated by reference herein. The 7T pixel differs from a 5T pixel in that two additional gates are added, which are a storage gate and a second transfer gate. In the case of a 7T pixel, there are control lines for an anti-blooming shutter gate, a first transfer gate, a second transfer gate, a reset transistor, and a row select transistor. In various embodiments, all of those controls could be shared over two or more adjacent rows after an appropriate number of column readout lines, which can also be referred to as pixel output busses or vertical readout busses, are added. For example, in various embodiments, all controls are shared over two rows of pixels and there are two vertical readout busses per column.

Thus, various embodiments use 7T global shutter pixels for the pixel array and all controls between two neighboring rows are shared by the pixels in those rows, which is made possible by having two readout lines per column of pixels so that the pixels in the two neighboring rows can operate synchronously using the shared controls. Additionally, with 7T pixels, the readout circuitry including the reset transistor, the source follower transistor, and the read select transistor can be shared among neighboring pixels, as is illustrated in FIG. 5 of the above referenced U.S. patent application Ser. No. 12/963,566.

With reference again to FIG. 5, in various other embodiments, a four transistor (4T) rolling shutter pixel can be used in the pixel array 32 for the pixels 3, which will allow for a rolling shutter operation. In such embodiments, each of the 4T pixels can have its own readout circuitry that is not shared with other pixels. As was explained above, an example of a 4T pixel is illustrated in FIG. 2A of U.S. patent application Ser. No. 12/405,903. In various embodiments of the present invention using 4T pixels, there are two vertical column readout lines per column of pixels, and a transfer control line, a reset control line, and a row control line are shared between two corresponding rows of pixels in the pixel array. This type of sharing of control lines with multiple column readout lines as opposed to sharing of readout circuitry increases the readout speed from the pixel array, so it may be advantageous to employ such an architecture when a faster frame rate is needed. Such an architecture also saves space and allows for smaller pixels because three horizontal control lines are eliminated for each pair of rows while only adding one additional vertical column readout line per column of pixels. In further embodiments, more than two column readout lines can be provided for each column of pixels and the control lines can be shared by more than two rows of pixels.

Referring to FIGS. 3, 5, and 6, in various embodiments, the image sensor 31 is capable of performing a global shutter operation when having global shutter pixels in which charge is stored in the readout node 23 of each of the pixels 3 to await readout. In various embodiments, the image sensor 31 is capable of performing a rolling shutter operation when having rolling shutter pixels. The control lines $\mathbf{35}_{1,2}$, $\mathbf{35}_{3,4}$, . . . , $\mathbf{35}_{(n-1),n}$ each include a portion that is located outside of the pixel array 32 and a portion that is located within the pixel array 32. For example, a portion of each of the control lines $\mathbf{35}_{1,2}$ is located outside of the pixel array 32 as shown by the label 38, and a portion of each of the control lines $\mathbf{35}_{1,2}$ is located within the pixel array 32 as shown by the label 39. A portion of each of the control lines $\mathbf{35}_{1,2}$ that is located within the pixel array 32 is connected within the pixel array 32 to pixels 3 in more than one row and more than one column of the pixel array 32. In particular, each control line of the control lines $\mathbf{35}_{1,2}$ is connected to pixels 3 in each column of the pixel array 32 that are also in the first and second rows of the pixel array 32. The connection of control lines to pixels in adjacent rows within a pixel array is illustrated in FIG. 6, and such connections can be repeated for each column in the pixel array for the rows to which the control lines are connected. Thus, FIGS. 5 and 6 illustrate a way to build up a pixel array including dual rows of pixels with shared controls.

The control lines $\mathbf{35}_{1,2}$, $\mathbf{35}_{3,4}$, . . . , $\mathbf{35}_{(n-1),n}$ have portions that are located within the pixel array 32 between two corresponding rows of the pixel array 32 to which the control lines $\mathbf{35}_{1,2}$, $\mathbf{35}_{3,4}$, . . . , $\mathbf{35}_{(n-1),n}$ are connected. In various embodiments, the pixels 3 in two adjacent rows that are connected to the same control lines are connected to different column readout lines from each other. For example, the pixels 3 in the first and second rows of the pixel array 32 are connected to the same control lines $\mathbf{35}_{1,2}$, but are connected to different column readout lines since the pixels 3 in the second row of the pixel array 32 are connected to the column readout lines $\mathbf{36}_{11}$, $\mathbf{36}_{21}$, . . . , $\mathbf{36}_{m1}$, while the pixels 3 in the first row of the pixel array 32 are connected to the column readout lines $\mathbf{36}_{12}$, $\mathbf{36}_{22}$, . . . , $\mathbf{36}_{m2}$.

In various embodiments, the control lines $\mathbf{35}_{1,2}$, $\mathbf{35}_{3,4}$, . . . , $\mathbf{35}_{(n-1),n}$ each include four control lines. For example, in various embodiments the control lines $\mathbf{35}_{(i-1),i}$ for rows i and i−1 include the reset control line $\mathbf{41}_{(i-1),i}$, the row select control line $\mathbf{43}_{(i-1),i}$, the transfer control line $\mathbf{45}_{(i-1),i}$, and the anti-blooming control line $\mathbf{47}_{(i-1),i}$. The transfer control line $\mathbf{45}_{(i-1),i}$ allows for distributing a transfer control signal to control a transfer of charge from a photodiode in each of the pixels that are connected to the transfer control line $\mathbf{45}_{(i-1),i}$. The anti-blooming control line $\mathbf{47}_{(i-1),i}$, allows for distributing an anti-blooming control signal to pixels to control a draining of charge from a photodiode in each of the pixels that are connected to the anti-blooming control line $\mathbf{47}_{i-1),i}$. The reset control line $\mathbf{41}_{i-1),i}$ allows for distributing a reset control signal to pixels to control a resetting of a floating diffusion node in each of the pixels that are connected to the reset control line $\mathbf{41}_{(i-1),i}$. The row select control line $\mathbf{43}_{(i-1),i}$, allows for distributing a row select control signal to control an outputting of a signal from each of the pixels that are connected to the row select control line $\mathbf{43}_{i-1),i}$ to corresponding column readout lines.

In some embodiments, each of the control lines extends more than one-fourth of a distance across the pixel array. For example, the control lines $\mathbf{35}_{1,2}$, $\mathbf{35}_{3,4}$, . . . , $\mathbf{35}_{(n-1),n}$ each extend at least substantially across an entire width of the pixel array 32. In some embodiments, each control line is arranged such that a control signal provided over the control line passes an edge of the pixel array and is then distributed over a portion of the control line located within the pixel array to pixels in more than one row of the pixel array. For example, each of the control lines $\mathbf{35}_{1,2}$ is arranged such that a control signal provided over the control line passes an edge 52 of the pixel array 32 and is then distributed over a portion 39 of the control line located within the pixel array 32 to pixels 3 in the first row and the second row of the pixel array 32. In some embodiments, a portion of each of the control lines $\mathbf{35}_{1,2}$, $\mathbf{35}_{3,4}$, . . . , $\mathbf{35}_{(n-1),n}$ is located in a different layer of the pixel array 32 than a layer of the pixel array 32 in which the pixels 3 are located.

Figure 7:
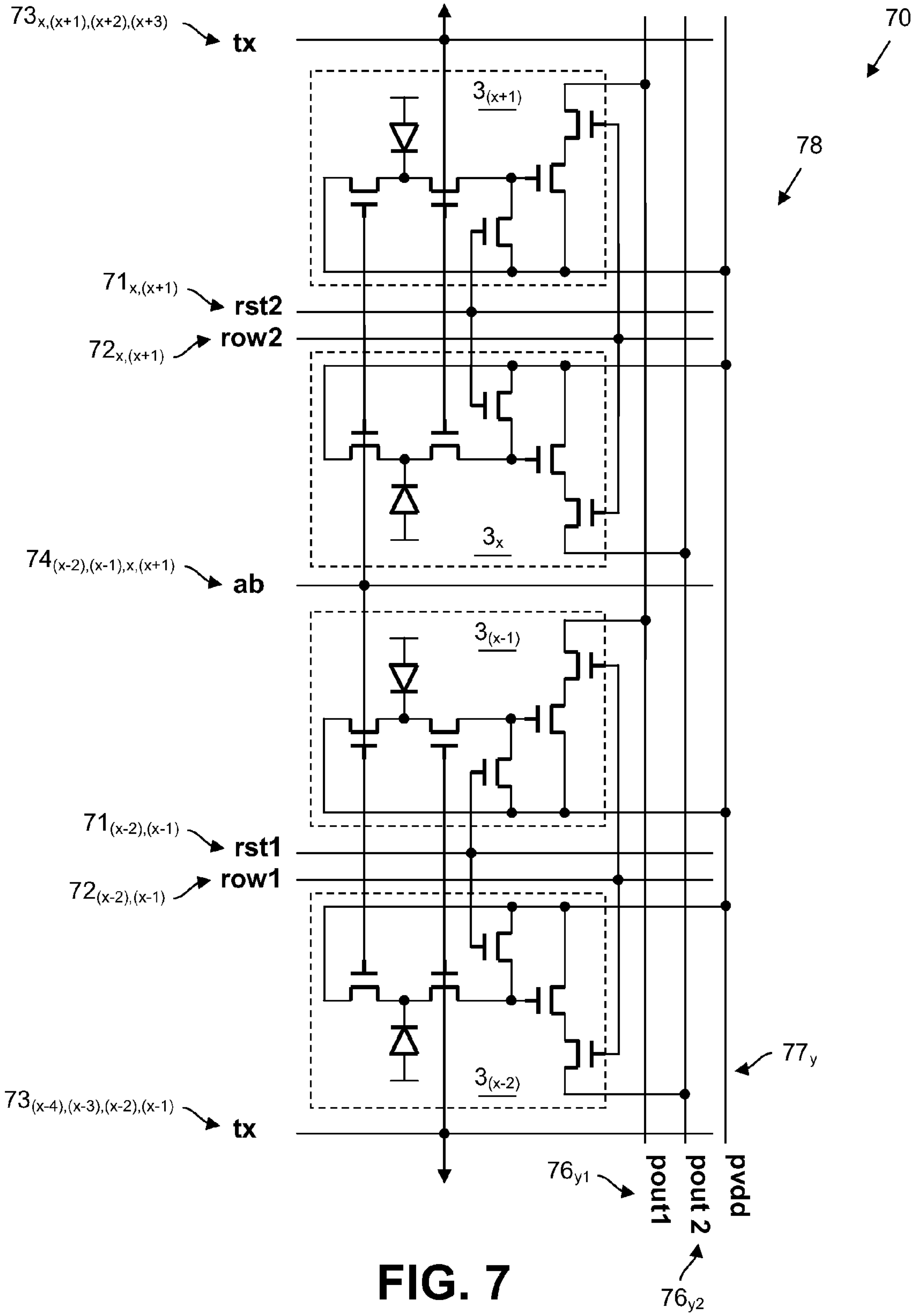
FIG. 7 illustrates a portion of an image sensor in accordance with an embodiment of the present invention in which some controls are shared over more than two rows.

FIG. 7 illustrates a portion of an image sensor 70 in accordance with an embodiment of the present invention in which some controls are shared over more than two rows. FIG. 7 illustrates pixels in four rows of one column of a pixel array 78, but it should be understood that the pixel array 78 actually includes a plurality of additional rows and a plurality of additional columns that are not shown in FIG. 7 and that the pattern shown in FIG. 7 can be repeated to construct the pixel array 78. The image sensor 70 includes a pixel $\mathbf{3}_x$ in a row x of the pixel array 78, a pixel $\mathbf{3}_{(x+1)}$ in a row x+1 of the pixel array 78, a pixel $\mathbf{3}_{(x-1)}$ in a row x−1 of the pixel array 78, and a pixel $\mathbf{3}_{(x-2)}$ in a row x−2 of the pixel array 78. The pixels $\mathbf{3}_x$, $\mathbf{3}_{(x+1)}$, $\mathbf{3}_{(x-1)}$, and $\mathbf{3}_{(x-2)}$ are illustrated as having a structure that is the same as the pixel 3 (refer to FIGS. 2 and 3), and the subscripts in the labels for the pixels are merely provided to indicate the rows in which the pixels are located. In various other embodiments, any suitable type of pixel may be used in the pixel array 78, such as a four transistor (4T) pixel, a seven transistor (7T) pixel, or the like.

The image sensor 70 further includes a reset control line $\mathbf{71}_{x,(x+1)}$, a row select control line $\mathbf{72}_{x,(x+1)}$, a reset control line $\mathbf{71}_{(x-2),(x-1)}$, a row select control line $\mathbf{72}_{(x-2),(x-1)}$, a transfer control line $\mathbf{73}_{x,(x+1),(x+2),(x+3)}$, a transfer control line $\mathbf{73}_{(x-4),(x-3),(x-2),(x-1)}$, and an anti-blooming control line $\mathbf{74}_{(x-2),(x-1),x,(x+1)}$. The subscripts in the labels for the control lines are merely provided to indicate the rows of pixels in the pixel array 78 to which the control lines are connected.

With reference to FIGS. 3 and 7, the reset control line $\mathbf{71}_{x,(x+1)}$ is connected within the pixel array 78 to a gate of the reset transistor 26 of the pixel $\mathbf{3}_x$ and to a gate of the reset transistor 26 of the pixel $\mathbf{3}_{(x+1)}$. The row select control line $\mathbf{72}_{x,(x+1)}$ is connected within the pixel array 78 to a gate of the row select transistor 28 of the pixel $\mathbf{3}_x$ and to a gate of the row select transistor 28 of the pixel $\mathbf{3}_{(x+1)}$. In various embodiments, the reset control line $\mathbf{71}_{x,(x+1)}$, and the row select control line $\mathbf{72}_{x,(x+1)}$ are shared by all pixels in row x and row x+1 of the pixel array 78. The reset control line $\mathbf{71}_{(x-2),(x-1)}$ is connected within the pixel array 78 to a gate of the reset transistor 26 of the pixel $\mathbf{3}_{(x-2)}$ and to a gate of the reset transistor 26 of the pixel $\mathbf{3}_{(x-1)}$. The row select control line $\mathbf{72}_{(x-2),(x-1)}$ is connected within the pixel array 78 to a gate of the row select transistor 28 of the pixel $\mathbf{3}_{(x-2)}$ and to a gate of the row select transistor 28 of the pixel $\mathbf{3}_{(x-1)}$. In various embodiments, the reset control line $\mathbf{71}_{(x-2),(x-1)}$, and the row select control line $\mathbf{72}_{(x-2),(x-1)}$ are shared by all pixels in row x−2 and row x−1 of the pixel array 78.

The transfer control line $\mathbf{73}_{x,(x+1),(x+2),(x+3)}$ is connected within the pixel array 78 to the transfer gate 22 of the pixel $\mathbf{3}_x$, to the transfer gate 22 of the pixel $\mathbf{3}_{(x+1)}$, to the transfer gate 22 of a pixel $\mathbf{3}_{(x+2)}$ (not shown in FIG. 7), and to the transfer gate 22 of a pixel $\mathbf{3}_{(x+3)}$ (not shown in FIG. 7). In various embodiments, the transfer control line $\mathbf{73}_{x,(x+1),(x+2),(x+3)}$ is shared by all pixels in row x, row x+1, row x+2, and row x+3 of the pixel array 78. The transfer control line $\mathbf{73}_{(x-4),(x-3),(x-2),x-1)}$ is connected within the pixel array 78 to the transfer gate 22 of the pixel $\mathbf{3}_{(x-1)}$, to the transfer gate 22 of the pixel $\mathbf{3}_{(x-2)}$, to the transfer gate 22 of a pixel $\mathbf{3}_{(x-3)}$ (not shown in FIG. 7), and to the transfer gate 22 of a pixel $\mathbf{3}_{(x-4)}$ (not shown in FIG. 7). In various embodiments, the transfer control line $\mathbf{73}_{(x-4),(x-3),(x-2),(x-1)}$ is shared by all pixels in row x−1, row x−2, row x−3, and row x−4 of the pixel array 78.

The anti-blooming control line $\mathbf{74}_{(x-2),(x-1),x,(x+1)}$ is connected within the pixel array 78 to the anti-blooming gate 24 of the pixel $\mathbf{3}_{(x-2)}$, to the anti-blooming gate 24 of the pixel $\mathbf{3}_{(x-1)}$, to the anti-blooming gate 24 of the pixel $\mathbf{3}_x$, and to the anti-blooming gate 24 of the pixel $\mathbf{3}_{(x+1)}$. In various embodiments, the anti-blooming control line $\mathbf{73}_{(x-2),(x-1),x,(x+1)}$ is shared by all pixels in row x−2, row x−1, row x, and row x+1 of the pixel array 78.

The anti-blooming gate diffusion 25, the first terminal of the reset transistor 26, and the first terminal of the source follower transistor 27 of each of the pixels $\mathbf{3}_{(x-2)}$, $\mathbf{3}_{(x-1)}$, $\mathbf{3}_x$, and $\mathbf{3}_{(x+1)}$, are connected to a power source (not shown) to receive a voltage (Vdd) over a voltage line (pvdd) $\mathbf{77}_y$, which is a shared voltage line among all the pixels in a column y of the pixel array 78. The pixels $\mathbf{3}_{(x-1)}$ and $\mathbf{3}_{x+1)}$ are connected to provide output on the column readout line (pout1) $\mathbf{76}_{y1}$. The pixels $\mathbf{3}_{(x-2)}$ and $\mathbf{3}_x$ are connected to provide output on the column readout line (pout2) $\mathbf{76}_{y2}$. Since the pixel $\mathbf{3}_x$ and the pixel $\mathbf{3}_{(x+1)}$ are connected to different column readout lines from each other, they can provide output at a same time. Also, since the pixel $\mathbf{3}_{(x-1)}$ and the pixel $\mathbf{3}_{(x-2)}$ are connected to different column readout lines from each other, they can provide output at a same time.

Thus, FIG. 7 provides an example in which some controls, including global controls such as transfer controls (tx) and anti-blooming controls (ab) are shared over four rows, while in-row controls such as reset controls and row select controls are shared over two adjacent rows.

Thus, various embodiments allow for global shutter controls (tx line and ab line) to be shared over 4 lines of pixels, and for readout controls (rst and row) to be shared over 2 rows. In various embodiments, global controls tx and ab may also be laid out as a mesh made of an essentially polysilicon layer connection.

In various embodiments, the readout horizontal controls, including the reset controls and row select controls, can also be shared over more than two rows of pixels. However, to avoid the conflict of multiple pixels driving the same vertical column readout lines, the number of vertical column readout lines would need to be increased. For example, sharing one row select control line and one reset control line among four rows of pixels is possible, but the number of column readout lines per column would need to be increased to four. By increasing the number of column readout lines per column of pixels, the number of rows that share a common reset control line and a common row select control line can be increased.

Figure 8:
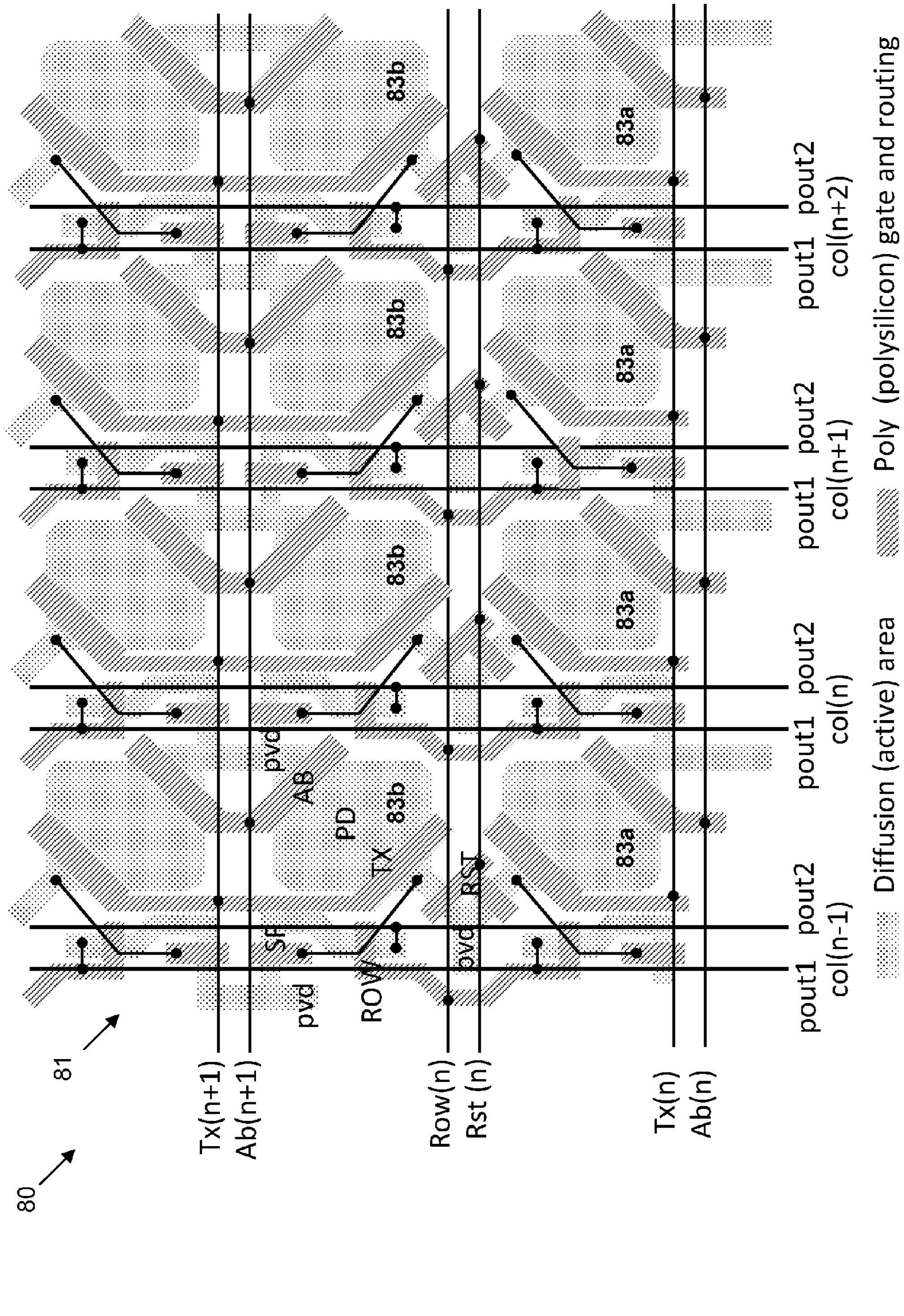
FIG. 8 illustrates a layout of a portion of an image sensor in accordance with an embodiment of the present invention.

FIG. 8 illustrates a layout of a portion of an image sensor 80 in accordance with an embodiment of the present invention. The image sensor 80 includes a pixel array 81 with a plurality of rows and a plurality of columns of pixels. In FIG. 8, pixels in three rows and four columns of the pixel array 81 are illustrated, but it should be understood that the pixel array 81 actually includes more rows and columns of pixels. The pixel array 81 includes pixels **83*a* in one row of the pixel array 81, and also includes pixels 83*b* in an adjacent row of the pixel array 81. The row of pixels 83*a* shares reset and row select controls with the row of pixels 83*b*, and the row of pixels 83*a* is mirrored top-to-bottom with respect to the row of pixels 83*b* to form a mirrored cell. The row of pixels 83*a* and the row of pixels 83*b* that are mirrored with respect to each other can be considered a row pair that share reset and row select controls. In the example layout of FIG. 8**, the transfer and anti-blooming controls are laid out in pairs on the outer sides of the row pair.

Thus, various embodiments allow for mirroring adjacent rows of pixels top-to-bottom for a more compact cell placement for the pixel array 81. Some embodiments have pixels mirrored left-to-right in a pixel array, and some embodiments have pixels mirrored both top-to-bottom and left-to-right in a pixel array. For global controls, such as a transfer control (tx) and an anti-blooming control (ab), in combination with mirroring top-bottom left-right, such a layout creates many combinations of how the pixels could be connected to the global control lines. For example, global tx and ab may each be designed as a vertical zig-zag.

In various embodiments, global controls tx and ab may also be laid out as a mesh made of an essentially polysilicon layer connection. Such a mesh may be a two-dimensional grid and the connections between some pixel may be done horizontally, while between others the connections are done vertically or diagonally. Thus, such a mesh may be a two-dimensional polysilicon web. In some embodiments, an image sensor is designed to perform a global shutter operation, and transfer control lines and anti-blooming lines are run vertically with respect to each column of pixels in a pixel array of the image sensor. In various embodiments where the transfer control signals and anti-blooming control signals are global, the transfer control lines and anti-blooming control lines can be run horizontally or vertically in the pixel array, and can be shared among a corresponding two, four, or more rows of pixels in the pixel array. In some embodiments, it may be preferable to run the transfer control lines vertically in a pixel array to allow for running pixels in a low-noise 4T mode.

Figure 9:
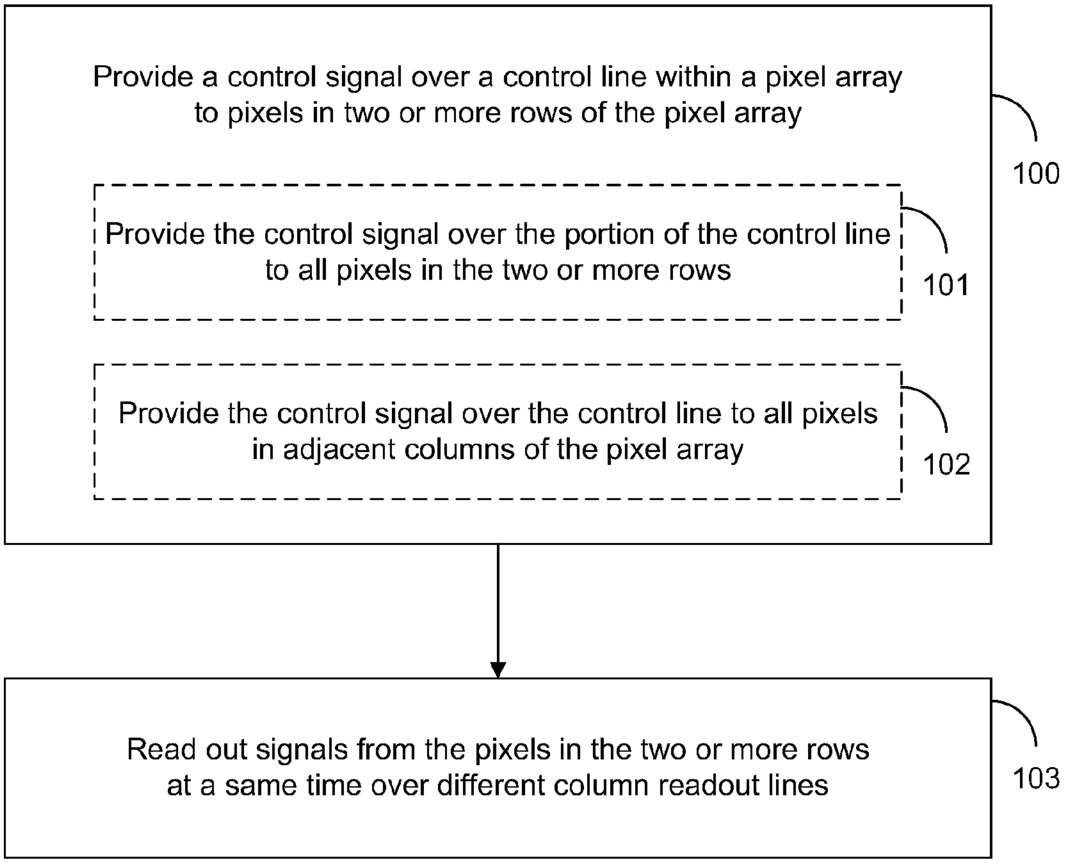
FIG. 9 illustrates a method in accordance with an embodiment of the present invention.

FIG. 9 illustrates a method in accordance with an embodiment for reading out signals from a pixel array in an image sensor that performs a global shutter operation. In step 100, a control signal is provided over a control line that is within a pixel array to pixels in two or more rows of the pixel array. In some embodiments, a portion of the control line is located between two of the two or more rows, and the providing includes a step 101 of providing the control signal over the portion of the control line to all pixels in the two or more rows. In some embodiments, the providing includes a step 102 of providing the control signal over the control line to all pixels in adjacent columns of the pixel array. The method then continues to step 103. In step 103, pixel output signals are read out from the pixels in the two or more rows at a same time over different column readout lines.

In some embodiments, the control signal comprises a transfer control signal that is provided to a transfer gate of each of the pixels in the two or more rows. In some embodiments, the control signal comprises an anti-blooming control signal that is provided to an anti-blooming gate of each of the pixels in the two or more rows. In some embodiments, the control line comprises a reset control line. In some embodiments, the control line comprises a row select control line.

In a pixel array, rows of pixels can be called lines of pixels, and columns of pixels can be called lines of pixels. A method in accordance with an embodiment includes reading out from pixels in an image sensor with a global shutter when at least one control is shared between two or more lines of the pixels. A method in accordance with another embodiment includes reading out from pixels in an image sensor with a global shutter when at least one control is shared between two lines of the pixels that are adjacent rows of the pixels.

A method in accordance with an embodiment includes reading out from pixels in an image sensor with a global shutter when all controls are shared between two or more lines of the pixels. A method in accordance with another embodiment includes reading out from pixels in an image sensor with a global shutter when all controls are shared between two or more lines of the pixels and some of the lines of the pixels are connected to different vertical readout busses.

A method in accordance with an embodiment includes reading out from pixels in an image sensor with a global shutter when all controls are shared between two lines of the pixels and the two lines have pixels connected to two different vertical readout busses. A method in accordance with another embodiment includes reading out from pixels in an image sensor with a global shutter when a transfer gate control or an anti-blooming (shutter) gate control is run either horizontally or vertically and is shared among two or more rows or columns of the pixels.

An image sensor and a method in accordance with another embodiment of the present invention allows for sharing a reset control line between two rows of pixels even with a single vertical column readout line per column or pixels. If there are separate row control lines for two rows of pixels, a reset control line for providing a reset control signal can be shared by the two rows of pixels by using the following method. After a global transfer of charge from photodiodes of the pixels to floating diffusions within the pixels, the signals from the pixels are read row by row as follows:

(i) a row select control signal for a first row is enabled and signals output from the pixels of the first row over column readout lines are stored in first column storages;

(ii) a row select control signal for a second row is enabled and signals output from the pixels of the second row over the column readout lines are stored in second column storages;

(iii) a reset control signal is provided over the shared reset control line to reset the pixels in the two rows;

(iv) the row select control signal for the first row is enabled and the reset signals from the pixels of the first row are read into the column readout circuits and a difference between the pixel output signal and the pixel reset signal for each pixel in the first row is obtained and possibly digitized in column analog-to-digital converters;

(v) the row select control signal for the second row is enabled and the reset signals from the pixels of the second row are read into the column readout circuits and a difference between the pixel output signal and the pixel reset signal for each pixel in the second row is obtained and possibly digitized in the column analog-to-digital converters;

(vi) the procedure repeated for the next 2 rows and so on until all rows have been read.

In various embodiments, the readout of the reset signals of the pixels may be performed before the readout of the pixel output signals from the pixels. If space is critical, the image sensor with a shared reset control line among, for example, two rows of 5T pixels can save space even with one vertical readout control line per column of pixels.

In various embodiments, global shutter pixels in two or more rows of a pixel array share a reset control line and a row select control line, and there are two or more column readout lines for each column of pixels in the pixel array. In some embodiments, 7T pixels in two or more rows of a pixel array share a second transfer control line that provides a signal to a second transfer gate of the pixels, and also share a reset control line and a row select control line, and there are two or more column readout lines for each column of pixels in the pixel array. In some embodiments, rolling shutter 4T 2-way shared (horizontal share) pixels in two or more rows of a pixel array share a transfer control line, a reset control line, and a row select control line, and there are two or more column readout lines for each column of pixels in the pixel array.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. Various modifications and changes that come within the meaning and range of equivalency of the claims are intended to be within the scope of the invention.

What is claimed is:

1. An image sensor, comprising:

a pixel array comprising a plurality of pixels, the plurality of pixels including a first pixel, a second pixel, and a third pixel that are all in a same column of the pixel array;

wherein the first pixel, the second pixel, and the third pixel share a first control line in the pixel array, and the first pixel and the third pixel are both connected to provide output to a first column readout line;

wherein the first pixel and the second pixel share a second control line in the pixel array, and the second pixel is connected to provide output to a second column readout line that is a different column readout line than the first column readout line; and wherein the first control line is connected to more than one pixel in a row of the pixel array in which the first pixel is located, and is connected to more than one pixel in a row of the pixel array in which the second pixel is located, and is connected to more than one pixel in a row of the pixel array in which the third pixel is located.

2. The image sensor of claim 1, wherein a portion of the second control line that is located within the pixel array is connected within the pixel array to all pixels in two or more rows of pixels.

3. The image sensor of claim 2, wherein the portion of the second control line is located between two of the two or more rows of pixels.

4. The image sensor of claim 3, wherein the two of the two or more rows of pixels are adjacent rows in the pixel array and are mirrored top-to-bottom with respect to each other.

5. The image sensor of claim 1, wherein pixels in more than two rows in the pixel array share the first control line in the pixel array.

6. The image sensor of claim 1, wherein each of the first and second column readout lines is connected to a corresponding subset of pixels in a corresponding column of the pixel array.

7. The image sensor of claim 1, wherein the first control line is connected to all pixels in more than two rows in the pixel array.

8. The image sensor of claim 1, wherein the first control line comprises an anti-blooming control line for distributing an anti-blooming control signal to control a draining of charge from a photodiode in each pixel that is connected to the first control line.

9. The image sensor of claim 1, wherein the second control line comprises a reset control line for distributing a reset control signal to control a resetting of a floating diffusion node in each pixel that is connected to the second control line.

10. The image sensor of claim 1, wherein the second control line comprises a row select control line for distributing a row select control signal to control an outputting of a signal from each pixel that is connected to the second control line.

11. The image sensor of claim 1, wherein the pixels comprise four transistor pixels or five transistor pixels or seven transistor pixels.

12. The image sensor of claim 1, wherein the second control line is arranged such that a control signal provided over the control line passes an edge of the pixel array and is then distributed over the second control line to the first and second pixels.

13. The image sensor of claim 1, wherein the plurality of pixels are controllable to perform a global shutter operation.

14. The image sensor of claim 1, wherein all horizontal control lines in the pixel array for the pixels in two or more rows of pixels are shared among all of the pixels in the two or more rows of pixels.

15. The image sensor of claim 1, wherein the second control line is shared by two or more rows of pixels in the pixel array and extends across the pixel array between two of the two or more rows of pixels.

16. A method, comprising:

providing a first control signal over a first control line within a pixel array to a first pixel, a second pixel, and a third pixel that are in a same column of the pixel array;

providing a second control signal over a second control line within the pixel array to the first pixel and the second pixel;

reading out a first signal from the first pixel over a first column readout line and a second signal from the second pixel over a second column readout line at the same time; and reading out a third signal from the third pixel over the first column readout line after reading out the first signal from the first pixel over the first column readout line;

wherein the first control signal is provided over the first control line to more than one pixel in a row of the pixel array in which the first pixel is located, and to more than one pixel in a row of the pixel array in which the second pixel is located, and to more than one pixel in a row of the pixel array in which the third pixel is located.

17. The method of claim 16, wherein a portion of the second control line is located between two or more rows of the pixel array, and said providing the second control signal includes providing the second control signal over the portion of the second control line to all pixels in the two or more rows.

18. The method of claim 16, said providing the first control signal including providing the first control signal over the first control line to all pixels in more than two rows of the pixel array.

19. The method of claim 16, wherein the first control signal comprises a transfer control signal that is provided to a transfer gate of each of the first pixel, the second pixel, and the third pixel.

20. The method of claim 16, wherein the first control signal comprises an anti-blooming control signal that is provided to an anti-blooming gate of each of the first pixel, the second pixel, and the third pixel.

21. An image sensor, comprising:

a pixel array comprising a plurality of pixels, the plurality of pixels including a first pixel, a second pixel, and a third pixel that are in a same column of the pixel array;

wherein the first pixel and the third pixel share a first control line in the pixel array for receiving a first control signal;

wherein the first pixel and the third pixel are both connected to provide output to a first column readout line;

wherein the first pixel and the second pixel share a second control line in the pixel array for receiving a second control signal;

wherein the second pixel is connected to provide output to a second column readout line that is a different column readout line than the first column readout line; and wherein the first control line is connected to more than one pixel in a row of the pixel array in which the first pixel is located, and is connected to more than one pixel in a row of the pixel array in which the third pixel is located.

22. The image sensor of claim 21, wherein the first control line is connected to all pixels in more than two rows of the pixel array.

23. The image sensor of claim 21, wherein the first control line comprises an anti-blooming control line for distributing an anti-blooming control signal to control a draining of charge from a photodiode.

24. The image sensor of claim 21, wherein the pixel array includes two or more column readout lines for each column of pixels in the pixel array, and each column readout line is connected to a corresponding subset of pixels in a corresponding column of the pixel array.

* * * * *